(12) United States Patent
Ogawa et al.

(10) Patent No.: US 8,367,560 B2
(45) Date of Patent: Feb. 5, 2013

(54) SEMICONDUCTOR DEVICE MANUFACTURING METHOD

(75) Inventors: Arito Ogawa, Toyama (JP); Kunihiko Iwamoto, Hamanatsu (JP); Hiroyuki Ota, Tsukuba (JP)

(73) Assignees: Hitachi Kokusai Electric Inc., Tokyo (JP); Rohm Co., Ltd., Kyoto-shi (JP)

( * ) Notice: Subject to any disclaimer, the term of this patent is extended or adjusted under 35 U.S.C. 154(b) by 80 days.

(21) Appl. No.: 12/155,773

(22) Filed: Jun. 10, 2008

(65) Prior Publication Data

US 2008/0318442 A1    Dec. 25, 2008

(30) Foreign Application Priority Data

Jun. 15, 2007 (JP) ................. 2007-159176
May 27, 2008 (JP) ................. 2008-137831

(51) Int. Cl.
*H01L 21/31*  (2006.01)
*H01L 21/469* (2006.01)
*B05C 11/00*  (2006.01)
*B05C 13/00*  (2006.01)
*B05C 13/02*  (2006.01)

(52) U.S. Cl. .............. 438/785; 118/58; 257/E21.002
(58) Field of Classification Search ........... 257/E21.002; 438/785; 118/58
See application file for complete search history.

(56) References Cited

U.S. PATENT DOCUMENTS

| 6,632,729 B1 * | 10/2003 | Paton ............................ 438/535 |
| 2002/0146895 A1 * | 10/2002 | Ramdani et al. ............... 438/497 |
| 2003/0031793 A1 * | 2/2003 | Chang et al. ............. 427/255.28 |

FOREIGN PATENT DOCUMENTS

| EP | 1610393 A1 * | 12/2005 |
| JP | 2004-288885 | 10/2004 |
| JP | 2008-205136 | 9/2008 |

OTHER PUBLICATIONS

Iwamoto, K.; Tominaga, T.; Yasuda, T.; Nabatame, T.; and Toriumi, A.; "Advanced Layer-by-Layer Deposition and Annealing Process for High-Quality High-K Dielectrics Formation"; 2003, Electrochemical Societ Proceedings-vol. 2003-14, p. 265-272.*
McNeill, D.W.; Bhattacharya, S.;Wadsworth, H.; Ruddell, F.H.; Mitchell, S.J.N.; Armstrong, B.M.; and Gamble, H.S.; "Atomic later deposition of hafnium oxide dielectrics on silicon and germanium substrates"; Jul. 6, 2007; J. Mater. Sci.: Mater Electron (2008) 19:199-123.*
Stanley Wolf, Silicon Processing for the VSLI ERA 1986 Lattice Press vol. 1 p. 5.*
Citation 1: Thin Solid Films vol. 515 pp. 5109-5112 (Apr. 23, 2007).
Office Action dated Nov. 17, 2010 in a corresponding Korean Patent Application No. 10-2008-0055573 with English translation.

* cited by examiner

Primary Examiner — David S Blum
(74) Attorney, Agent, or Firm — Kratz, Quintos & Hanson, LLP

(57) ABSTRACT

A semiconductor device manufacturing method includes the steps of forming a silicate film by performing a first step of forming a metal oxide film on a silicon substrate, and a second step of inducing a solid phase reaction between the metal oxide film and a surface of the silicon substrate by heat treatment, and forming a high dielectric constant insulating film on the silicate film.

18 Claims, 12 Drawing Sheets

XPS spectrum of HfSiOₓ layer

SEMICONDUCTOR DEVICE MANUFACTURING METHOD

1. TECHNICAL FIELD

The present invention relates to a substrate processing apparatus and a semiconductor device manufacturing method.

The present invention for example is effective for forming a high dielectric constant gate insulating film in MOSFET devices or in other words, Metal-Oxide-Semiconductor Field Effect Transistors.

2. BACKGROUND ART

Along with making MOSFET devices more highly integrated and having high property, use of high dielectric constant insulating film in the gate insulating film is being studied. An interfacial layer formed from silicon dioxide ($SiO_2$) layer is typically used at the interface between the high dielectric constant insulating film and the silicon (Si) substrate in view of the need for reliability and mobility.

However, film utilizing $SiO_2$ as the interfacial layer has a low dielectric constant so that forming a thin film with an EOT or in other words, equivalent oxide thickness of 0.8 nanometers or less is extremely difficult.

Also, forming a high dielectric constant insulating film directly on the silicon substrate without using an interfacial layer causes large numbers of dangling bonds that adversely affect the electrical characteristics. Moreover, a SiOx layer is formed at the interface between the silicon substrate and the high dielectric constant insulating film during the LSI forming process. Consequently, forming a thin film in an equivalent oxide thickness is difficult.

DISCLOSURE OF INVENTION

The present invention has an object of providing a substrate processing apparatus and a semiconductor device manufacturing method that can prevent adverse effects on electrical characteristics and provide a thinner EOT.

An aspect of the present invention provides a semiconductor device manufacturing method comprising the steps of:

forming a metal oxide film on a silicon substrate, and forming a silicate film by inducing a solid phase reaction between the metal oxide film and the silicon substrate by heat treatment, and forming a high dielectric constant insulating film on the silicate film.

Another aspect of the present invention provides a semiconductor device manufacturing method comprising the steps of:

forming a silicate film by repeating forming of a high dielectric constant insulating film on a silicon substrate and inducing of a solid phase reaction between the high dielectric constant insulating film and the silicon substrate by heat treatment, and forming a high dielectric constant insulating film on the silicate film.

Yet another aspect of the present invention provides a semiconductor device manufacturing method comprising the steps of:

forming a hafnium silicate film by repeating forming of a hafnium oxide film on a silicon substrate, and inducing of a solid phase reaction between the hafnium oxide film and the silicon substrate by heat treatment, and forming a hafnium oxide film on the hafnium silicate film.

Still another aspect of the present invention provides a substrate processing apparatus comprising:

a first processing chamber for forming a high dielectric constant insulating film on a silicon substrate, a second processing chamber for heat treating the silicon substrate, a transfer chamber installed between the first processing chamber and the second processing chamber for transferring the silicon substrate between the first processing chamber and the second processing chamber, a transfer robot installed in the transfer chamber for transferring the silicon substrate;

a controller for controlling the operation to; transfer the silicon substrate into the first processing chamber by the transfer robot, and form the high dielectric constant insulating film on the silicon substrate in the first processing chamber, and transfer the silicon substrate formed with the high dielectric constant insulating film from the first processing chamber into the second processing chamber by the transfer robot, and heat treat the silicon substrate formed with the high dielectric constant insulating film in the second processing chamber to induce a solid phase reaction between the high dielectric constant insulating film and the silicon substrate to form a silicate film, and repeat these operations to form a silicate film with a specified film thickness on the surface of the silicon substrate, and then transfer the silicon substrate formed with the silicate film with the specified thickness from the second processing chamber into the first processing chamber, and form a high dielectric constant insulating film on the silicate film with the specified film thickness in the first processing chamber.

The above aspects allow providing a substrate processing apparatus and a method for manufacturing semiconductor devices that can prevent adverse effects on electrical characteristics and provide a thinner EOT.

DETAILED DESCRIPTION OF PREFERRED EMBODIMENTS

Figure 1:
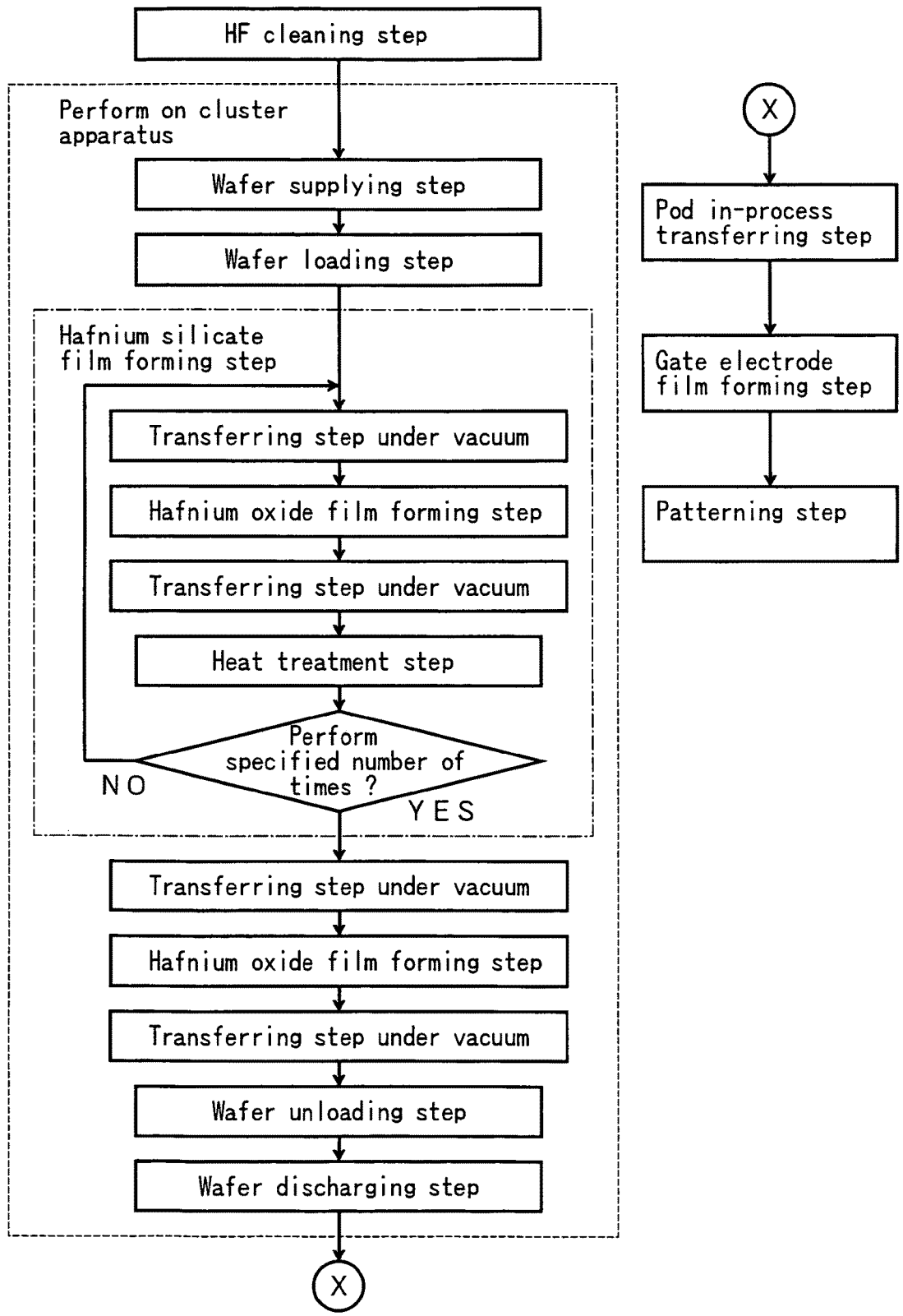
FIG. 1 is a flow chart showing the process for forming the MOSFET gate insulating film of an embodiment of the present invention.

An embodiment of the present invention is described next while referring to the drawings.

FIG. 1 is a flow chart showing the process for forming the MOSFET high dielectric constant gate insulating film of an embodiment of the present invention.

Figure 2:
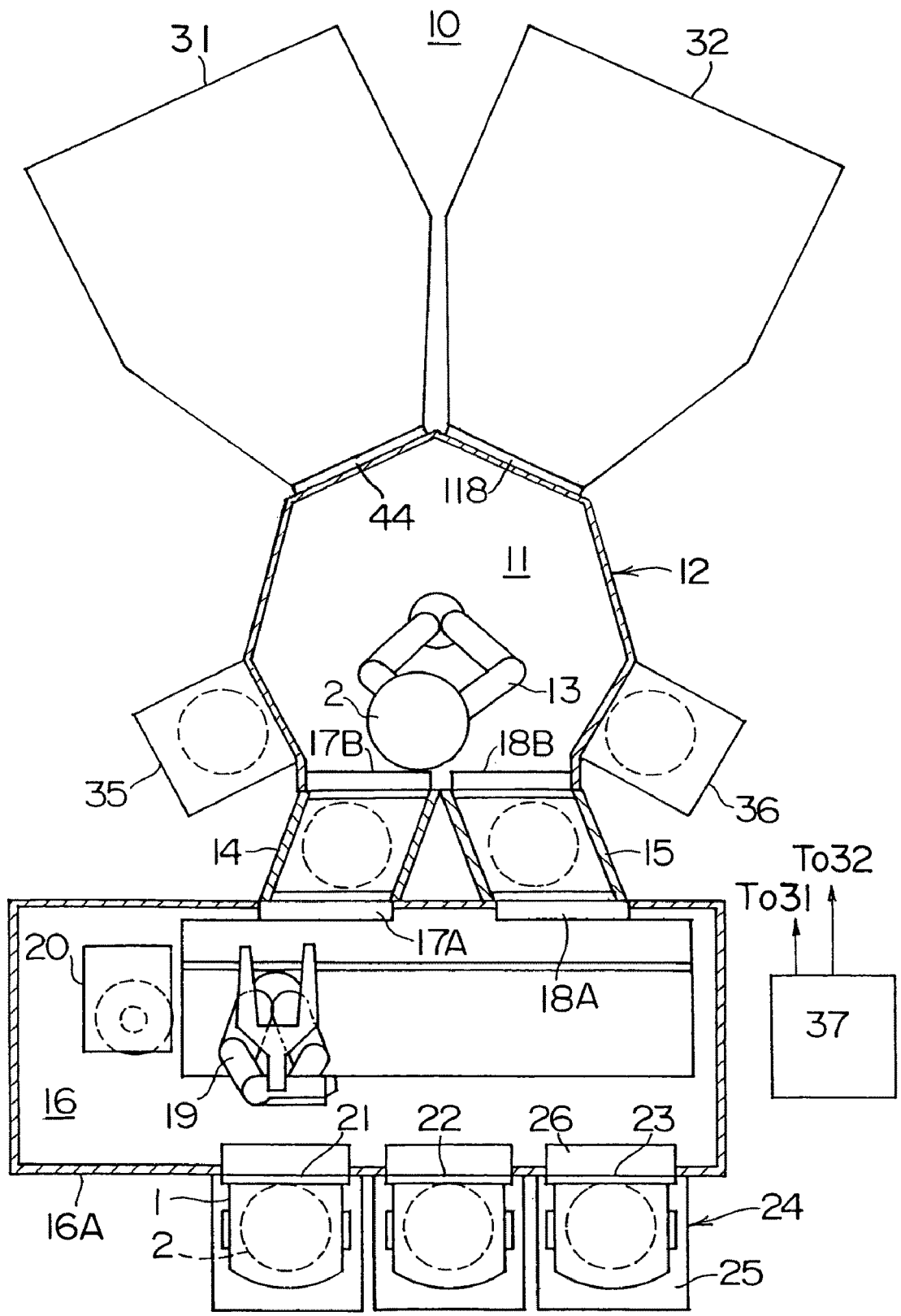
FIG. 2 is a plan cross sectional view showing the cluster apparatus in the embodiment of the present invention.
Figure 3:
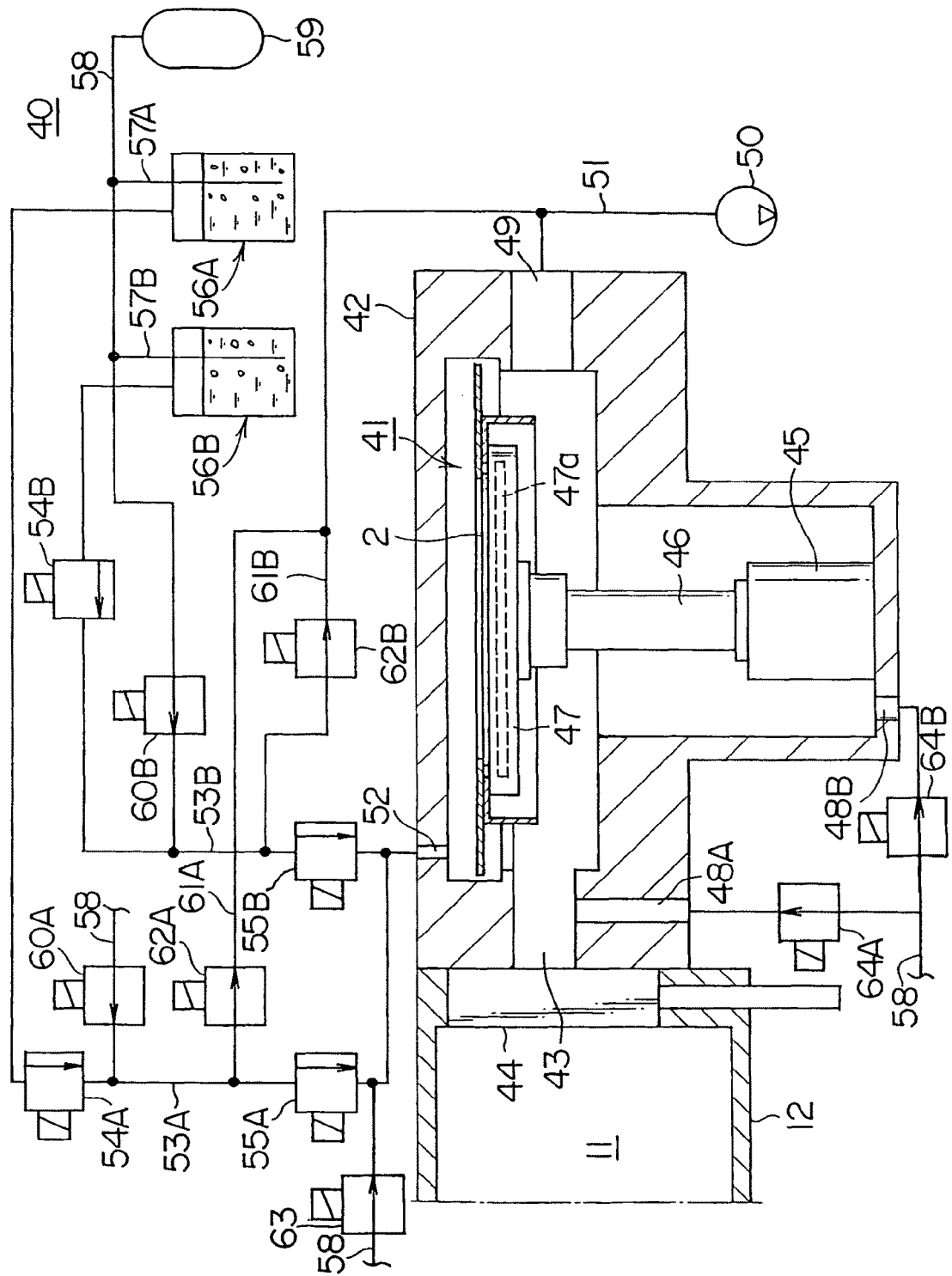
FIG. 3 is a front cross sectional view showing the ALD apparatus for the cluster apparatus in the embodiment of the present invention.
Figure 4:
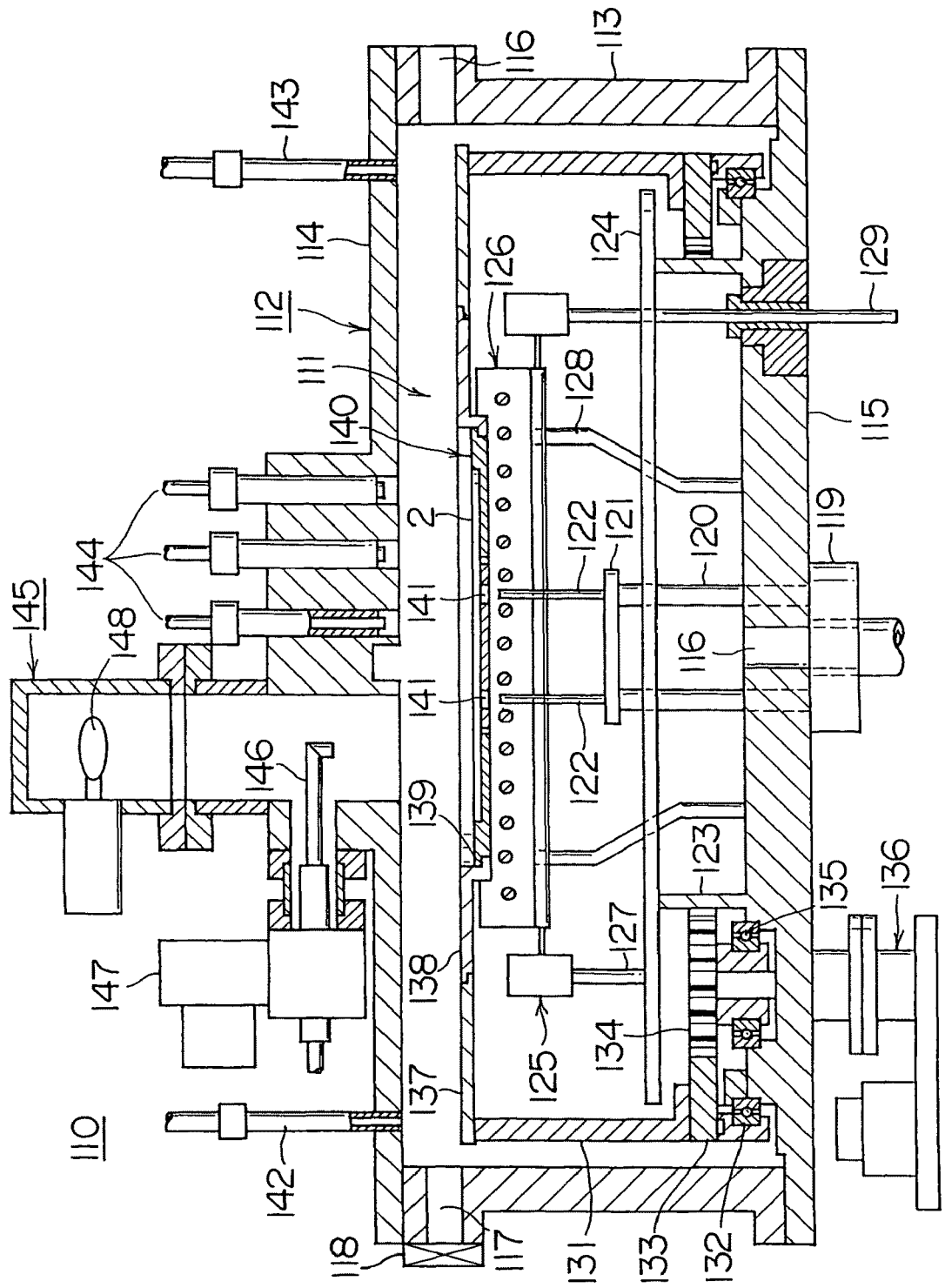
FIG. 4 is a front cross sectional view showing the RTP apparatus for the cluster apparatus in the embodiment of the present invention.

FIG. 2 through FIG. 4 are drawings showing the substrate processing apparatus of the embodiment of the present invention.

The substrate processing apparatus of the embodiment of the present invention is described next.

In this embodiment, the substrate processing apparatus of this invention is structurally a cluster apparatus as shown in FIG. 2, and functionally is utilized in the MOSFET high dielectric constant gate insulating film forming method.

The cluster apparatus of this embodiment utilizes a FOUP (front opening unified pod. hereinafter, called "pod") 1 as the wafer transfer carrier (substrate storage container) for transferring silicon wafers 2 (hereinafter, sometimes called "wafers 2") serving as the silicon substrate.

The cluster apparatus 10 as shown in FIG. 2 contains a case 12 forming a first wafer transfer chamber (hereinafter, called "negative pressure transfer chamber") 11. The negative pressure transfer chamber 11 is structured as a transfer chamber built to withstand pressure (negative pressure) below atmospheric pressure. The case (hereinafter, called "negative pressure transfer chamber case") 12 forming the negative pressure transfer chamber 11 is a box shape sealed at both the top and bottom and with a heptagonal shape as seen from a plan view.

A wafer transfer device (hereinafter, called "negative pressure transfer device") 13 is installed in the center section of the negative pressure transfer chamber 11 as a transfer robot for transferring the wafer 2 under negative pressure. The negative pressure transfer device 13 is configured as a SCARA (selective compliance assembly robot arm) robot.

The long side wall among the seven side walls in the negative pressure transfer chamber case 12 adjacently connects a carry-in prechamber (hereinafter, called "carry-in chamber") 14 and a carry-out prechamber (hereinafter, called "carry-out chamber") 15.

The cases of the carry-in chamber 14 and the carry-out chamber 15 are formed in a box shape sealed at both the top and bottom ends and having roughly diamond shapes as seen from a plan view, and utilize a load-lock chamber structure capable of withstanding negative pressure.

A case 16A adjoins the carry-in chamber 14 and the carry-out chamber 15 on the opposite of the negative pressure transfer chamber 11. The case 16A contains a second wafer transfer chamber 16 (hereinafter called "positive pressure transfer chamber"). This positive pressure transfer chamber 16 is a structure capable of maintaining atmospheric pressure or higher (hereinafter, called "positive pressure"). The case 16A of the positive pressure transfer chamber 16 is formed in a box shape sealed at both the top and bottom ends and having a laterally long rectangular shape as seen from a plan view.

A gate valve 17A is installed at the boundary between the carry-in chamber 14 and the positive pressure transfer chamber 16. A gate valve 17B is installed between the carry-in chamber 14 and the negative pressure transfer chamber 11.

A gate valve 18A is installed at the boundary between the carry-out chamber 15 and the positive pressure transfer chamber 16. A gate valve 18B is installed at the boundary between the carry-out chamber 15 and the negative pressure transfer chamber 11.

A second wafer transfer device (hereinafter, called "positive pressure transfer device") 19 for transferring the wafer 2 under a positive pressure is installed in the positive pressure transfer chamber 16. This positive pressure transfer device 19 is configured as a SCARA robot.

Along with being raised and lowered by an elevator installed in the positive pressure transfer chamber 16, the positive pressure transfer device 19 is moved back and forth to the right and left by a linear actuator.

A notch aligner 20 is installed on the left end of the positive pressure transfer chamber 16.

Three wafer carry-in/out ports (hereinafter, called "wafer carry-in ports") 21, 22, 23 are arrayed adjacently on the front wall of the positive pressure transfer chamber 16. The wafer 2 is carried into the positive pressure transfer chamber 16 through these wafer carry-in ports 21, 22, 23, and carried out from the positive pressure transfer chamber 16.

A pod opener 24 is installed on each of these wafer carry-in ports 21, 22, 23.

The pod opener 24 contains a placement stand 25 for mounting the pod 1, and a cap fitter/remover 26 for attaching and removing the cap of the pod 1 mounted on the placement stand 25. The cap fitter/remover 26 opens and closes the wafer loading and unloading opening of the pod 1 by attaching and removing the cap of the pod 1 mounted on the placement stand 25.

An in-process transfer device (RGV) not shown in the drawing, supplies the pod 1 to the placement stand 25 of the pod opener 24, and removes the pod 1 from the placement stand 25 of the pod opener 24.

As shown in FIG. 2, a first processing unit 31 and a second processing unit 32 are connected respectively on the two adjacent side walls among the seven sidewalls in the negative pressure transfer chamber case 12. The two side walls are positioned on the rear side of the negative pressure transfer chamber 12.

A gate valve 44 (See FIG. 3) is installed between the first processing unit 31 and the negative pressure transfer chamber 11.

A gate valve 118 (See FIG. 4) is installed between the second processing unit 32 and the negative pressure transfer chamber 11.

A first cooling unit 35 and a second cooling unit 36 are respectively connected to the two sidewalls among the seven sidewalls on the negative pressure transfer chamber case 12. The first cooling unit 35 and the second cooling unit 36 each cool the processed wafer 2.

The cluster apparatus 10 contains a controller 37. The controller 37 controls the overall sequence flow described later on.

In this embodiment, the first processing unit 31 is structurally a single wafer warm wall substrate processing apparatus and functionally is an ALD (Atomic Layer Deposition) apparatus (hereinafter, called "ALD apparatus") 40.

This ALD apparatus 40 contains a case 42 forming a processing chamber 41 as shown in FIG. 3. The case 42 contains an internal heater (not shown in drawing) for heating the walls of the processing chamber 41.

A wafer carry-in/out port (hereinafter, called "wafer carry-in port") 43 is formed on the boundary with the negative pressure transfer chamber 11 in the case 42. The gate valve 44 opens and closes the wafer carry-in port 43.

An elevator drive device 45 is installed on the bottom of the processing chamber 41. This elevator drive device 45 raises and lowers an elevator shaft 46. A holding jig 47 for holding the wafers 2 is supported horizontally on the upper edge of the elevator shaft 46.

A heater 47a for heating the wafers 2 is installed in the holding jig 47.

A purge gas supply port 48A and a purge gas supply port 48B are respectively formed on the bottom walls of the wafer carry-in port 43 and the processing chamber 41. An argon gas supply line 58 serving as the purge gas supply line is connected respectively by way of a stop valve 64A and a stop valve 64B to the purge gas supply port 48A and the purge gas supply port 48B. An argon gas supply source 59 is connected to the argon gas supply line 58.

An exhaust port 49 is formed on a section opposite the wafer carry-in port 43 in the case 42. An exhaust line 51 connected to an exhaust device 50 such as a vacuum pump is connected to the exhaust port 49.

A process gas supply port 52 is formed in the ceiling wall of the case 42 so as to connect to the processing chamber 41. A first process gas supply line 53A and a second process gas supply line 53B are connected to the process gas supply port 52.

A first bubbler 56A is connected by way of an upstream stop valve 54A and a downstream stop valve 55A to the first process gas supply line 53A. A bubbling pipe 57A of the first bubbler 56A is connected to the argon gas supply line 58 connected to the argon gas supply source 59.

The argon gas supply line 58 is connected by way of a stop valve 60A between the downstream stop valve 55A and the upstream stop valve 54A of the first processing gas supply line 53A. The upstream end of a vent line 61A is connected between the downstream stop valve 55A and the contact point with the argon gas supply line 58 of the first processing gas supply line 53A. The downstream end of the vent line 61A is connected to the exhaust line 51 that is connected to the exhaust device 50 by way of a stop valve 62A.

The argon gas supply line 58 is connected to the first processing gas supply line 53A by way of a stop valve 63 on the side farther downstream than the downstream stop valve 55A.

A second bubbler 56B is connected to the second processing gas supply line 53B by way of an upstream stop valve 54B and a downstream stop valve 55B. A bubbling pipe 57B of the second bubbler 56B is connected to the argon gas supply line 58 that connects to the argon gas supply source 59.

The argon gas supply line 58 is connected by way of a stop valve 60B between the upstream stop valve 54B and the downstream stop valve 55B of the second processing gas supply line 53B. The upstream end of a vent line 61B connects between the contact point with the argon gas supply line 58 of the second processing gas supply line 53B and the downstream stop valve 55B. The downstream end of the vent line 61B is connected to the exhaust line 51 connected to the exhaust device 50 by way of a stop valve 62B.

A section of the second processing gas supply line 53B that is further downstream than the downstream stop valve 55B, connects to a section that is further downstream than the downstream stop valve 55A of the first processing gas supply line 53A. The first processing gas supply line 53A and the second processing gas supply line 53B merge into one piece further downstream than this contact point, and connect to the processing gas supply port 52.

In the present embodiment, the second processing unit 32 utilizes an RTP (Rapid Thermal Processing) apparatus 110 as shown in FIG. 4.

As shown in FIG. 4, this RTP apparatus 110 contains a case 112 forming a processing chamber 111 for processing the wafer 2. A side wall 113 formed in a cylindrical shape open at the top and bottom ends, and a disk-shaped top plate 114 for sealing the top opening of the side wall 113, and a disk-shaped bottom plate 115 for sealing the bottom opening of the side wall 113 are combined to form the case 112 with a cylindrical hollow shape.

An exhaust port 116 is formed in a section on the upper side wall of the side wall 113 so as to connect the inside and outside of the processing chamber 111. The exhaust port 116 is connected to an exhaust device (not shown in drawing) in order to evacuate the processing chamber 111 to below atmospheric pressure (hereinafter called "negative pressure").

A wafer carry-in/out port (hereinafter called "wafer carry-in port") 117 for carrying the wafer 2 in and out of the processing chamber 111 is formed on the side wall 113 at a position on the side opposite the exhaust port 116 on the upper side wall. A gate valve 118 opens and closes the wafer carry-in port 117.

An elevator drive device 119 is installed on the center line on the bottom surface of the bottom plate 115. This elevator drive device 119 raises and lowers an elevator shaft 120. The elevator shaft 120 is inserted into the bottom plate 115 and supported for free sliding movement upwards and downwards relative to the bottom plate 115.

An elevator plate 121 is clamped horizontally on the upper end of the elevator shaft 120. Multiple (usually three or four) lifter pins 122 are clamped vertically erect on the upper surface of the elevator plate 121. Each of the lifter pins 122 rises and lowers the wafer while supporting the wafer 2 from below by rising and lowering along with the rising/lowering of the elevator plate 121.

A support tube 123 is affixed on the upper surface of the bottom plate 115 at the outside of the elevator shaft 120. A cooling plate 124 is affixed horizontally on the upper end surface of the support tube 123.

A first heating lamp group 125 and a second heating lamp group 126 containing multiple heating lamps are installed above the cooling plate 124 in order from the bottom and each group is installed horizontally. The first heating lamp group 125 and the second heating lamp group 126 are respectively supported horizontally by a first support pillar 127 and a second support pillar 128.

A power supply cable 129 for the first heating lamp group 125 and the second heating lamp group 126 is routed through the bottom plate 115 and through to the outside.

A turret 131 inside the processing chamber 111 is positioned concentrically with the processing chamber 111. The turret 131 is clamped on the upper surface of an inner spur gear 133. The turret 131 is positioned concentrically with the inner spur gear 133. The inner spur gear 133 is supported horizontally by a bearing 132 interposed in the bottom plate 115.

A drive spur gear 134 engages with the inner spur gear 133. The drive spur gear 134 is supported horizontally by a bearing 135 interposed in the bottom plate 115. The drive spur gear 134 is driven by a susceptor rotator device 136 installed below the bottom plate 115.

An outer platform 137 formed in a ring shape of flat plate is affixed and supported horizontally on the upper end surface of the turret 131. An inner platform 138 is affixed horizontally on the inner side of the outer platform 137.

A susceptor 140 on the bottom end of the inner circumference of the inner platform 138 is held and engaged with an engage section 139 affixed radially inwardly at the inner circumferential bottom end of the inner platform 138. Insertion holes 141 are respectively formed at positions opposite each lifter pin 122 of the susceptor 140.

An annealing gas supply pipe 142 and an inert gas supply pipe 143 are respectively connected on the top plate 114 to connect to the processing chamber 111.

Multiple probes 144 for a heat radiation thermometer are inserted in the top plate 114 mutually facing the upper surface of the wafer 2 and at positions offset along the radial direction from the center of the wafer 2 to the periphery. The heat radiation thermometer sends the temperature measurements one after the other to the controller based on the detected radiant light by the multiple probes 144.

An emissivity measurement device 145 is installed at the other position on the top plate 114. The emissivity measurement device 145 makes non-contact measurements of the emissivity from the wafer 2. The emissivity measurement device 145 includes a reference probe 146. A reference probe motor 147 rotates the reference probe 146 within a perpendicular plane.

A reference lamp 148 is installed on the upper side of the reference probe 146 facing the tip of the reference probe 146. The reference lamp 148 irradiates a reference light. The reference probe 146 is optically connected to the heat radiation thermometer. The heat radiation thermometer corrects the temperature measurements by comparing the photon density from the wafer 2 and the photon density of the reference light from the reference lamp 148.

The cluster apparatus 10 is next utilized as one process in the manufacturing process of the semiconductor device to form a silicate film as an interfacial layer on the surface of the silicon substrate, and to form a high dielectric constant insulating film on this silicate film. The method is described next while referring to FIG. 1.

In this embodiment, a silicate film as an interfacial layer is formed on the surface of a silicon substrate by forming a metal oxide film on the silicon substrate and then applying a heat treatment to induce a solid phase reaction between the silicon of the silicon substrate and the metal oxide film.

In this embodiment, a hafnium oxide ($HfO_2$) film is formed as the metal oxide film on the silicon substrate, and heat treatment then applied to induce a solid phase reaction between this hafnium oxide film and the silicon substrate to form a hafnium silicate (HfSiOx) film as a silicate film on the surface of the silicon substrate, and a hafnium oxide ($HfO_2$) film then formed as a high dielectric constant insulating film on this hafnium silicate film. This example is described next in detail.

In the following description, the controller 37 controls the operation of each unit making up the cluster apparatus 10.

The wafer 2 as the silicon substrate supplied into the cluster apparatus 10 is cleaned in advance in a hydrogen fluoride (HF) cleaning process (See FIG. 1).

In the wafer supplying step shown in FIG. 1, the cap fitter/remover 26 removes the cap of the pod 1 supplied onto the placement stand 25 of the cluster apparatus 10 to open the wafer loading and unloading opening of the pod 1.

When the pod 1 is opened, the positive pressure transfer device 19 installed in the positive pressure transfer chamber 16 picks up one wafer 2 at a time from the pod 1 by way of the wafer carry-in port (21 or 22 or 23), supplies the wafer 2 into the carry-in chamber 14, and transfers the wafer 2 onto the temporary carry-in chamber placement stand.

During this transfer operation, the gate valve 17A opens the positive pressure transfer chamber 16 side of the carry-in chamber 14. The gate valve 17B closes the negative pressure transfer chamber 11 side of the carry-in chamber 14. The pressure within the negative pressure transfer chamber 11 is maintained below atmospheric pressure for example at 100 Pa.

In the wafer loading step shown in FIG. 1, the gate valve 17A closes the positive pressure transfer chamber 16 side of the carry-in chamber 14, and the exhaust device (not shown in drawing) exhausts the carry-in chamber 14 to a negative pressure.

When the pressure within the carry-in chamber 14 depressurizes to a preset pressure value, the gate valve 17B opens the negative pressure transfer chamber 11 side of the carry-in chamber 14.

Next, the negative pressure transfer device 13 of the negative pressure transfer chamber 11 picks up one wafer 2 at a time from the temporary carry-in chamber placement stand and carries the wafer 2 under a vacuum into the negative pressure transfer chamber 11.

The gate valve 17B then closes the negative pressure transfer chamber 11 side of the carry-in chamber 14.

Then, the gate valve 44 of the first processing unit 31 opens and the negative pressure transfer device 13 transfers the wafer 2 under a vacuum to the first processing unit 31, and loads the wafer 2 into the processing chamber of the first processing unit 31.

The processing chamber of the first processing unit 31 is depressurized in advance to a preset pressure value.

The carry-in chamber 14 and the negative pressure transfer chamber 11 are exhausted to a negative pressure that removes oxygen and moisture beforehand from the interior during carry-in of the wafer into the first processing unit 31 so that oxygen and moisture from the outside are definitely prevented from intruding into the processing chamber of the first processing unit 31 during carry-in of the wafer into the first processing unit 31.

The process for forming the hafnium oxide ($HfO_2$) film serving as the metal oxide film on the silicon wafer 2 serving as the silicon substrate by the ALD method using the ALD apparatus 40 of the first processing unit 31 is described next while referring to FIG. 3.

In the present embodiment, TDMAH (Tetrakis-Dimethyl-Amino-Hafnium: $HF[N(CH_3)_2]_4$) is utilized as the hafnium (HF) precursor, and water vapor ($H_2O$) is utilized as the oxidizer.

In the ALD apparatus 40 of this embodiment, the TDMAH functioning as the liquid material is stored in the first bubbler 56A and this first bubbler 56A is used to vaporize the TDMAH. The flow rate of the argon gas used in the bubbling by this first bubbler 56A is for example 0.5 to 1 SLM (standard liters per minute).

In the ALD apparatus 40 of this embodiment, the second bubbler 56B is utilized to generate water vapor as the oxidizer. The flow rate of the argon gas used in the bubbling by this second bubbler 56B is for example also 0.5 to 1 SLM.

As shown in FIG. 3, the gate valve 44 opens the wafer carry-in port 43 of the ALD apparatus 40 serving as the first processing unit 31. The holding jig 47 is at this time lowered to the wafer transferring position. The negative pressure transfer device 13 carries the wafer 2 into the processing chamber 41 when the wafer carry-in port 43 opens.

After carrying the wafer 2 into the processing chamber 41 and placing the wafer onto the pushup pins not shown in the drawing, the negative pressure transfer device 13 retreats to outside the processing chamber 41. The gate valve 44 next closes the wafer carry-in port 43.

The elevator drive device 45 raises the holding jig 47 from the wafer transferring position to the higher wafer processing position shown in FIG. 3 by way of the elevator shaft 46. During that period, the holding jig 47 scoops up the wafer 2 on the pushup pins to place on the holding jig 47.

After the gate valve 44 has closed, the exhaust device 50 exhausts the interior of the processing chamber 41. The interior of the processing chamber 41 is adjusted to a specified pressure of for example 30 Pa in a range for example, between 10 and 100 Pa.

The heater 47a inside the holding jig 47 uniformly heats the wafer 2 to a specified temperature in a range for example, between 150 and 350 degrees C. During this period or in other words while adjusting the temperature and the pressure, the stop valves 63, 64A, 64B are open, and argon gas serving as the purge gas is exhausted from the exhaust port 49 and the exhaust line 51 while being supplied from the process gas supply port 52 and both the purge gas supply ports 48A, 48B into the processing chamber 41 and the space below the holding jig 47 within the processing chamber 41. The interior of the processing chamber 41 is in this way set to an inert gas atmosphere.

At the point in time where the wafer 2 is carried in, the stop valves 54A, 55A, 54B, 55B are each closed, and the stop valves 60A, 62A, 60B, 62B, 63, 64A, 64B are open.

Besides closing the stop valves 60A, 55A, 60B, 55B as preparation for supplying the material, the stop valves 54A, 62A, 54B, 62B are opened so that the vaporized hafnium material and the water vapor are respectively filled into the first process gas supply line 53A and the second processing gas supply line 53B.

Opening the stop valve 63 supplies argon gas as the purge gas into the processing chamber 41. Moreover, opening the stop valves 64A, 64B causes argon gas serving as the purge gas to flow from the purge gas supply ports 48A, 48B into the space below the holding jig 47 within the processing chamber 41. The flow rate of the argon gas is for example 0.1 to 1.5 SLM.

After the temperature of the wafer 2 stabilizes and the pressure within the processing chamber 41 stabilizes, the next steps (1) through (4) as one cycle are repeated until the hafnium oxide film reaches the target film thickness.

(1) Material Supply Step

The stop valve 55A opens along with closing of the stop valve 62A and that state is maintained for example for a period of 0.5 to 5 seconds. The vaporized hafnium material is in this way exhausted from the exhaust port 49 while being supplied into the processing chamber 41.

The hafnium material supplied into the processing chamber 41 is adsorbed onto the wafer 2.

(2) Material Exhaust Step

Next, the stop valve 60A opens along with closing of the stop valve 54A and that state is maintained for example for a period of 0.5 to 10 seconds. The argon gas is in this way exhausted from the exhaust port 49 while being supplied into the processing chamber 41 and the first processing gas supply line 53A. The interior of the processing chamber 41 and the interior of the first processing gas supply line 53A are in this way purged with argon gas, and the material supplied into the processing chamber 41 and the first processing gas supply line 53A is exhausted.

The stop valves 60A, 55A are next closed, and the stop valves 54A, 62A are opened to fill the vaporized hafnium material into the first processing gas supply line 53A.

(3) Oxidizer Supply Step

The stop valve 62B is closed and the stop valve 55B opened simultaneously with filling the vaporized hafnium material into the first processing gas supply line 53A and that state is maintained for example for a period of 0.5 to 15 seconds. The water vapor serving as the oxidizer is in this way exhausted from the exhaust port 49 while being supplied into the processing chamber 41.

The hafnium material adsorbed onto the surface of the wafer 2 in step (1) is in this way made to react with the water vapor, and a hafnium oxide film is formed at a film thickness of approximately 1 angstrom (Å) on the wafer 2.

(4) Oxidizer Exhaust Step

The stop valve 60B is opened along with closing of the stop valve 54B and that state is maintained for example for a period of 0.5 to 15 seconds. The argon gas is in this way exhausted from the exhaust port 49 while being supplied into the processing chamber 41 and the second processing gas supply line 53B. In other words, the interior of the processing chamber 41 and the interior of the second processing gas supply line 53B are purged with argon gas, and the oxidizer supplied into the processing chamber 41 and the second processing gas supply line 53B is exhausted.

Next, the stop valves 60B, 55B are closed, and the stop valves 54B, 62B are opened to fill the second processing gas supply line 53B with water vapor.

Usually, if forming the film by the ALD method, then the film of approximately 1 angstrom is formed in one cycle, and approximately one atomic layer is formed in two to three cycles.

Figure 13:
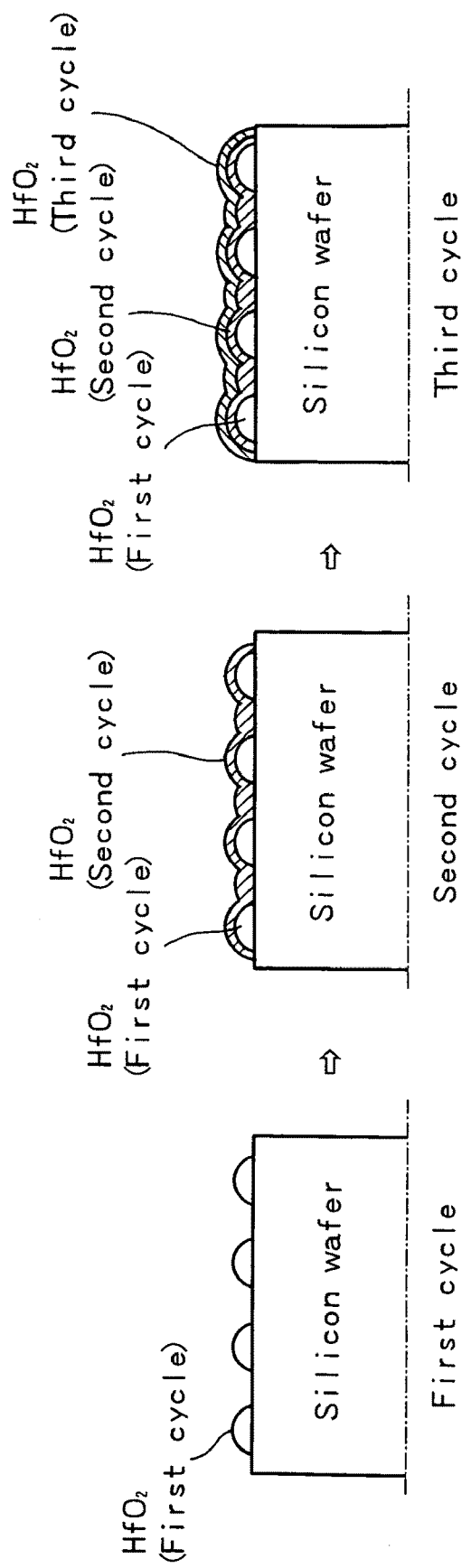
FIG. 13 is a cross sectional view showing the process for forming film by the ALD method.

In other words, as shown in FIG. 13, the film is formed in island shapes in one cycle, and a continuous film that is about one atomic layer is formed in two to three cycles.

Setting the above steps (1) through (4) as one cycle, the hafnium oxide film of the specified film thickness or in other words one atomic layer or less is formed by performing the one cycle one to three times.

After forming of the hafnium oxide film is finished, the interior of the processing chamber 41 is evacuated to a vacuum, and residual gases are eliminated from within the processing chamber 41. Inert gas is then supplied into the processing chamber 41 to set the interior of the processing chamber 41 to an inert gas atmosphere.

The holding jig 47 lowers from the wafer processing position to the wafer transferring position, and the film-formed wafer 2 is placed onto the pushup pins.

Then, the gate valve 44 on the ALD apparatus 40 opens so that the wafer carry-in port 43 opens, and the negative pressure transfer device 13 unloads the processed wafer 2 from the first processing unit 31 to the negative pressure transfer chamber 11 maintained at a negative pressure.

The negative pressure transfer device 13 transfers the wafer 2 under a vacuum to the second processing unit 32, and loads the wafer 2 into the processing chamber of the second processing unit 32.

The wafer 2 on which the hafnium oxide film was formed are next subjected to the heat treating process by using the RTP apparatus 110 of the second processing unit 32. This process is described while referring to FIG. 4.

As shown in FIG. 4, when the gate valve 118 of the RTP apparatus 110 serving as the second processing unit 32 is opened, the negative pressure transfer device 13 loads the wafer 2 from the wafer carry-in port 117 into the processing chamber 111, and places it onto the upper ends of the multiple lifter pins 122.

When the negative pressure transfer device 13 that transferred the wafer 2 onto the lifter pins 122, retreats to outside the processing chamber 111, the gate valve 118 shuts the wafer carry-in port 117.

The wafer 2 on the lifter pins 122 are delivered onto the susceptor 140 by the elevator drive device 119 lowering the elevator shaft 120. This state is shown in FIG. 4.

The interior of the processing chamber 111 is exhausted by way of the exhaust port 116 so as to reach a specified pressure in a range of 1 to 4000 Pa for example in a range of 1 to 1000 Pa while this processing chamber 111 is sealed airtight.

When the wafer 2 is delivered to the susceptor 140, the turret 131 where the wafer 2 is held by the susceptor 140 is rotated by the susceptor rotator device 136 via the drive spur gear 134 and the inner spur gear 133.

The first heating lamp group 125 and the second heating lamp group 126 rapidly heat the wafer 2 held on the susceptor 140 to a specified temperature within a range from 600 to 850 degrees C. and for example from 650 to 850 degrees C. while the susceptor 140 is being rotated by the susceptor rotator device 136. After reaching the specified heat treatment temperature, the temperature of the wafer 2 held by the susceptor 140 is maintained at that temperature.

An inert gas such as nitrogen gas is supplied into the processing chamber 111 from the annealing gas supply pipe 142 during this rotation and heating of the wafer 2.

The first heating lamp group 125 and the second heating lamp group 126 uniformly heat the wafer 2 held on the susceptor 140 while the susceptor rotator device 136 is rotating the susceptor 140, so that the entire surface of the wafer 2 is uniformly heat treated.

This heat treating causes a solid phase reaction between the silicon wafer 2 serving as the silicon substrate and the hafnium oxide film formed on the wafer 2, and forms a hafnium silicate (HfSiOx) film on the surface of the wafer 2.

When the preset specified processing time has elapsed in the RTP apparatus 110, the controller 37 ends the heating by the first heating lamp group 125 and the second heating lamp group 126, and starts rapid cooling of the wafer 2.

Then, after the processing chamber 111 has been exhausted to the specified negative pressure through the exhaust port 116, the gate valve 118 is opened. The negative pressure transfer device 13 then unloads the heat treated wafer 2 from the processing chamber 111 to the negative transfer chamber 11 in the reverse of the sequence used during carry-in.

The negative pressure transfer device 13 again transfers the heat treated wafer 2 under a vacuum to the first processing unit 31, and again loads the wafer 2 into the processing chamber 41 of the ALD apparatus 40 of the first processing unit 31.

The process for forming the hafnium oxide film by the ALD apparatus 40 and the process for heat treating by the RTP apparatus 110 are repeated a specified number of times as shown in FIG. 1.

By repeating the hafnium oxide film forming process and the heat treating process, a hafnium silicate film (hereinafter, called "super-thin hafnium silicate film") can be formed on the surface of the wafer 2 as a super-thin interfacial layer with satisfactory characteristics.

The number of times that the hafnium oxide film forming process and the heat treating process are repeated is preferably five times for the reasons related later on.

When finished repeating the two processes for the specified number of times, the wafer 2 formed with a super-thin hafnium silicate film is unloaded by the negative pressure transfer device 13 from the processing chamber 111 of the RTP apparatus 110 of the second processing unit 32 to the negative pressure chamber 11, and also transferred under a vacuum to the first processing unit 31, and then loaded into the processing chamber 41 of the ALD apparatus 40 of the first processing unit 31.

Then, in the hafnium oxide film forming process serving as the high dielectric constant insulating film forming process that is shown in FIG. 1, the ALD apparatus 40 forms the hafnium oxide film as the high dielectric constant insulating film on the super-thin hafnium silicate film as the interfacial layer.

The sequence in the process by which the ALD apparatus 40 forms the hafnium oxide film as the high dielectric constant insulating film on the super-thin hafnium silicate film, is identical to the ALD sequence in the process by which the aforementioned ALD apparatus 40 forms the hafnium oxide film as the metal oxide film.

Namely, the above described steps (1) through (4) making up one ALD cycle are repeated until a hafnium oxide film of the required thickness is formed as the high dielectric constant insulating film.

The hafnium oxide film is formed at the specified film thickness by repeating this ALD cycle a specified number of times in the high dielectric constant insulating film forming process. The gate valve 44 of the ALD apparatus 40 then opens when the residual gas within the processing chamber 41 is removed, and the negative pressure transfer device 13 unloads the film-formed wafer 2 from the first processing unit 31 to the negative pressure transfer chamber 11 maintained at a negative pressure.

In the wafer unloading step shown in FIG. 1 after the cluster apparatus 10 completes the hafnium oxide film forming process serving as the high dielectric constant insulating film forming process, the gate valve 18B opens the negative pressure transfer chamber 11 side of the carry-out chamber 15. The negative pressure transfer device 13 transfers the wafer 2 from the negative pressure transfer chamber 11 to the carry-out chamber 15 under a vacuum and places it to the temporary carry-out placement stand of the carry-out chamber 15.

The gate valve 18A in this case closes the positive pressure transfer chamber 16 side of the carry-out chamber 15 in advance, and an exhaust device (not shown in drawing) exhausts the carry-out chamber 15 to a negative pressure. When the carry-out chamber 15 has been depressurized to the preset pressure value, the gate valve 18B opens the negative pressure transfer chamber 11 side of the carry-out chamber 15 and the wafer unloading step is performed.

The gate valve 18B is then closed after the wafer unloading step.

The transferring path is maintained at a vacuum while transferring the wafer respectively from the carry-in chamber 14 to the first processing unit 31, from the first processing unit 31 to the second processing unit 32, from the second processing unit 32 to the first processing unit 31, and from the first processing unit 31 to the carry-out chamber 15. This vacuum prevents the foreign matter and impurities such as organic compounds from attaching to the wafer 2 or the forming of a natural oxidized film on the wafer 2 because the wafer 2 is not exposed to air during this period.

By repeating the above operation, the hafnium silicate film forming process as the interfacial layer wherein the hafnium oxide film forming process in the first processing unit 31 and the heat-treating process in the second processing unit 32 are repeatedly performed, and the forming process for the hafnium oxide film serving as the high dielectric constant insulating film in the first processing unit 31 are performed in sequence on 25 wafers 2 carried in as one batch to the carry-in chamber 14.

In the wafer discharging step shown in FIG. 1, after nitrogen gas was supplied to the carry-out chamber 15 maintained at a negative pressure, and the carry-out chamber 15 raised to atmospheric pressure, the gate valve 18A opens the positive pressure transfer chamber 16 side of the carry-out chamber 15.

Next, the cap fitter/remover 26 of the pod opener 24 removes the cap of the empty pod 1 mounted on the placement stand 25.

The positive pressure transfer device 19 of the positive pressure transfer chamber 16 then picks up the wafer 2 from the carry-out chamber 15, carries it out to the positive pressure transfer chamber 16 and charges it in the pod 1 by way of the wafer carry-in port 23 of the positive pressure transfer chamber 16.

The cap fitter/remover 26 of the pod opener 24 fits the cap of the pod 1 onto the wafer loading and unloading opening when storing of the 25 processed wafers 2 into pod 1 is complete, and closes the pod 1.

In this embodiment, the wafer 2 whose sequence of processing was completed by the cluster apparatus 10 is transferred in the pod in-process transferring step shown in FIG. 1 in a state where stored airtight within the pod 1, to the film-forming apparatus for implementing the gate electrode film forming step.

Film-forming apparatus for implementing the gate electrode film forming step may for example include a batch type vertical hot wall CVD apparatus, a single-wafer ALD apparatus, and a single-wafer CVD apparatus.

After the patterning step shown in FIG. 1, the electrode gate structure is then formed on the wafer 2.

In this embodiment, the metal oxide film formed on the silicon substrate and the silicon substrate are heat treated to induce a solid phase reaction and form a silicate film so that a satisfactory silicate film can be formed as the interfacial layer, and a super-thin and flat film also formed.

Moreover, dangling bonds can be minimized by inducing a solid phase reaction between the metal oxide film and the silicon substrate. Further, a silicate film is used so that a high dielectric constant can be obtained compared to $SiO_2$ film, which allows both satisfactory interfacial characteristics and EOT scaling.

In particular, when forming a metal oxide film by the ALD method, a satisfactory silicate film can be formed by performing the heat treatment at each film forming within one to three cycles. In other words, a satisfactory silicate film can be formed by performing the heat treatment at each film forming within approximately one atomic layer.

The merits obtained from using heat treatment to induce a solid phase reaction at each film forming within approximately one atomic layer (1 to 3 cycles ALD) is described next.

The $HfO_2$ film utilized as the metal oxide film has the property where oxygen (O) atoms in the film tend to easily leave from the film. A greater amount of oxygen (O) leave as the film is made thicker, and a smaller amount of oxygen (O) leave as the film is made thinner.

Therefore, when inducing a solid phase reaction by heat treatment at each film forming of a film that is comparatively thick such as several dozen atomic layer, the oxygen (O) eliminated from the $HfO_2$ film oxidizes the silicon wafer as the silicon substrate prior to inducing the silicate reaction, so that a film with a low-k (SiOx film and/or silicon rich HfSiOx film) is formed.

In contrast, when inducing a solid phase reaction by heat treatment at each film forming within approximately one atomic layer (1 to 3 cycles ALD), the amount of oxygen (O) eliminated from the $HfO_2$ film is comparatively small so that a silicate reaction is induced without forming a low-k film, and a suitable HfSiOx film can be formed.

Also, silicate is hard to form when the metal oxide film is thick, even if heat treating the metal oxide film and the silicon substrate. To form an adequate silicate film, the metal oxide film must be made thin and preferably is approximately one atomic layer or less, and more preferably is a layer less than one atomic layer.

An approximately one atomic layer can be formed in two to three cycles if using the ALD method.

Therefore, when using the ALD method, a satisfactory silicate film of about one atomic later can be formed if heat treating at each film forming in one to three cycles. An efficient reaction can be made to occur between the metal oxide film and the silicon substrate, and a satisfactory silicate film can be formed in particular by applying the heat treatment at each one film forming cycle. Performing the heat treatment at each one film forming cycle is therefore preferable when forming film by the ALD method.

Figure 11:
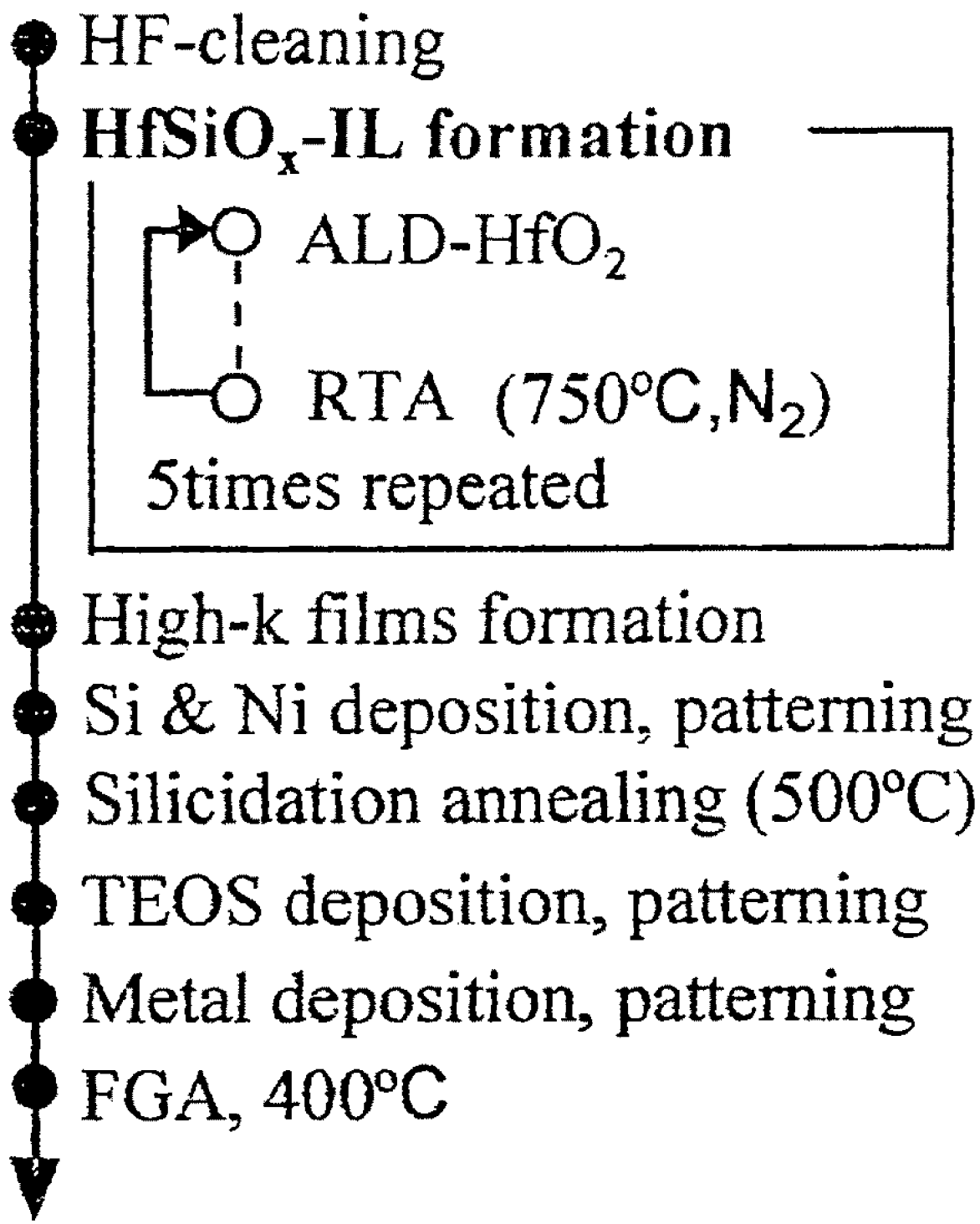
FIG. 11 is a flow chart showing the process for forming the MOSFET in the embodiment.
Figure 12:
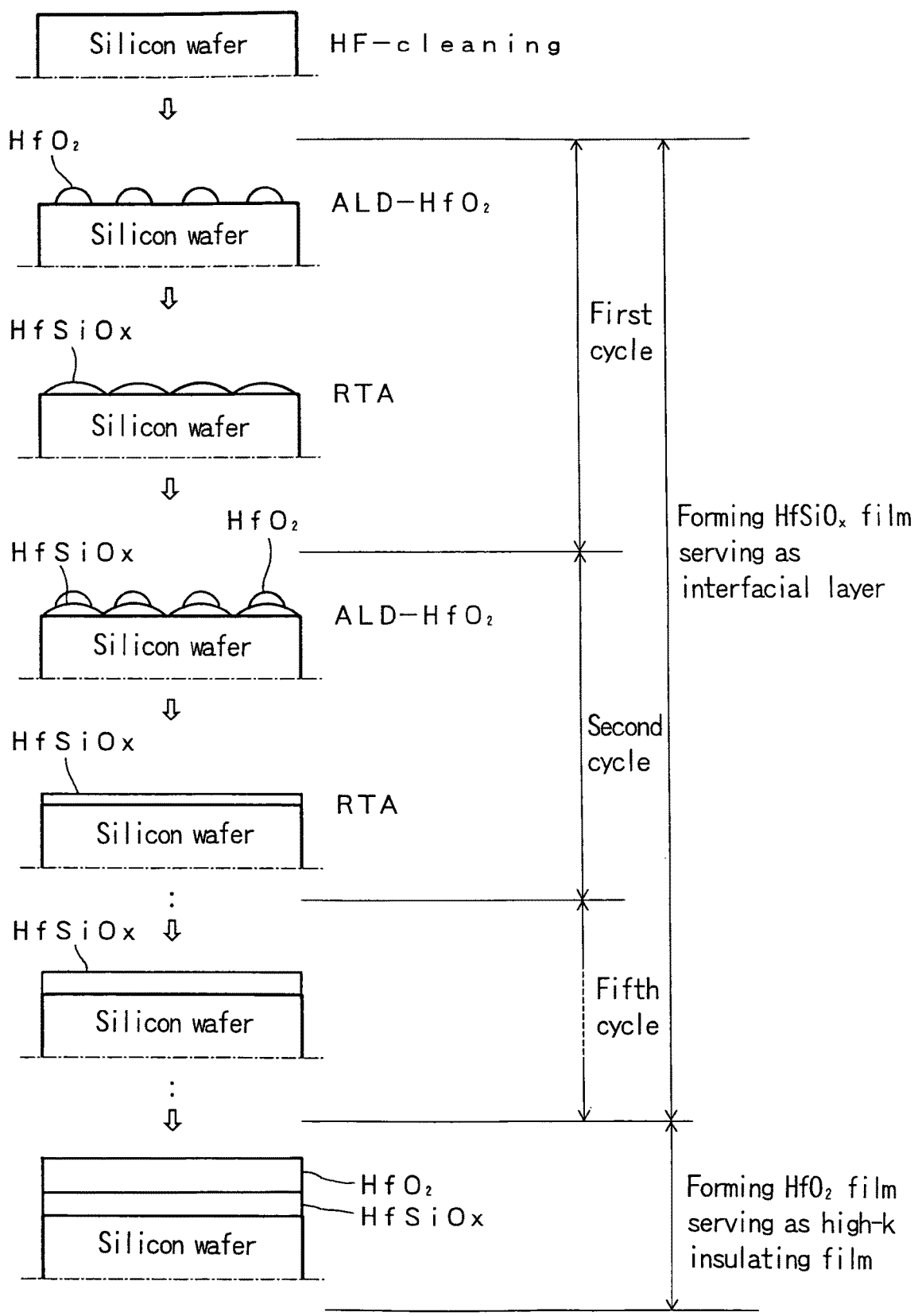
FIG. 12 is a flow chart and cross sectional view showing the process for forming the MOSFET gate insulating film in the embodiment.

An example using the method of the above described embodiment to form super-thin hafnium silicate film as the interfacial layer on the surface of the silicon wafer serving as the silicon substrate, and then form a MOSFET by forming a hafnium oxide film as the high dielectric constant gate insulating film over that hafnium silicate film is described next in detail while referring to FIG. 11 and FIG. 12.

The silicon wafer is first cleaned by using HF cleaning.

After the HF cleaning, a super-thin hafnium silicate film as the interfacial layer is formed on the surface of the silicon wafer (HFSiOx-IL formation).

Namely, an ALD apparatus performs one cycle of film forming to form a hafnium oxide film as the metal oxide film on the silicon wafer that was cleaned (ALD-$HfO_2$).

The processing conditions here are: a film forming temperature of 150 to 350 degrees C., a film forming pressure of 30 Pa, and a film thickness per one cycle of 1 (Å) angstrom.

Heat treating is performed next by RTA (Rapid Thermal Annealing) in a nitrogen gas atmosphere using an RTP apparatus; a solid phase reaction is induced between the silicon wafer and the hafnium oxide film to form the hafnium silicate film (RTA).

If the film forming temperature while using the ALD method is a low temperature such as 150 to 350 degrees C., no solid phase reaction will occur between the hafnium oxide film and the silicon wafer. Conversely, at high temperatures such as 900 degrees C., a solid phase reaction occurs but silicide also occurs (the oxygen leaves from the HfSiOx and it becomes HfSi) so that the film no longer functions as an insulating film. In other words, forming a hafnium silicate film while inducing a solid phase reaction between the hafnium oxide film and the silicon wafer requires the heat treatment temperature higher than the film forming temperature in the ALD method but also lowering the temperature below the temperature where silicide occurs.

In view of these conditions, the heat treatment temperature is 600 to 850 degrees C., and preferably 650 to 850 degrees C. In this embodiment, the heat treatment temperature was set to 750 degrees C.

The hafnium oxide film forming process and the heat treatment process by one cycle ALD are repeated five times, to form a super-thin hafnium silicate film as the interfacial layer on the surface of the silicon wafer (HfSiOx-IL formation).

Figure 14:
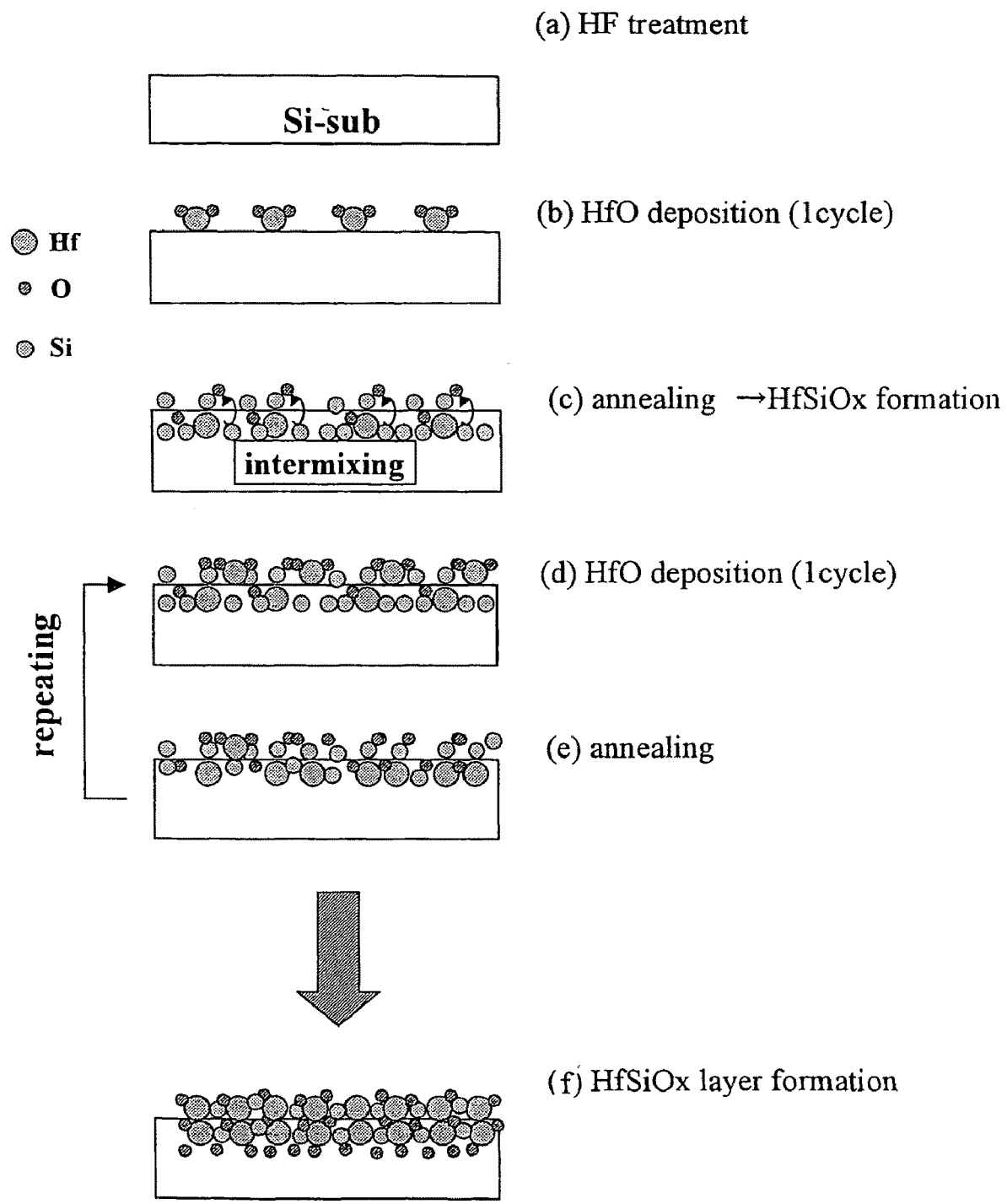
FIG. 14 is a flow chart and cross sectional view for describing the process and the mechanism for causing a solid phase reaction.

The mechanism for generating the solid phase reaction between the silicon wafer and the hafnium oxide (HfO$_2$) film formed on the silicon wafer when forming the super-thin hafnium silicate (HfSiOx) film is described next while referring to FIG. 14.

The HF cleaning (HF treatment) in FIG. 14(a) is performed and;

A HfO$_2$ film is then formed on the silicon wafer by one cycle ALD, in the hafnium oxide film forming process (first time) in FIG. 14(b);

The Hf atoms within the HfO$_2$ film are diffused into the silicon wafer in the heat treatment process (first time) in FIG. 14(c). In this case, the Si (silicon atoms) within the silicon wafer are discharged to form the Hf—O—Si bond. Some of the oxygen oxidize the silicon wafer, and silicon within the silicon wafer is simultaneously discharged.

A HfSiOx film is in this way formed on the surface of the silicon wafer. At this stage, the HfSiOx film of less than one atomic layer is formed.

In the hafnium oxide film forming process (second time) in FIG. 14(d), an HfO$_2$ film is formed by one cycle ALD, on the HfSiOx film of less than one atomic layer that was formed on the surface of the silicon wafer.

In the heat treatment process (second time) in FIG. 14(e), the Hf atoms within the HfO$_2$ film are diffused into the silicon wafer. In this case, the silicon within the silicon wafer is discharged to form the Hf—O—Si bond. Some of the oxygen oxidizes the silicon wafer, and silicon within the silicon wafer is simultaneously discharged. At this stage, an HfSiOx film of about one atomic layer is formed on the surface of the silicon wafer.

The HfSiOx film reacts with the silicon wafer, and the HfO$_2$ film and the HfSiOx film react from the third time onward so that the diffusion of silicon from inside the silicon wafer to within the HfSiOx film is suppressed. The diffusion of silicon from inside the HfSiOx film to within the HfO film is also suppressed. The solid phase reaction therefore occurs several times and then no longer occurs when a certain number of times has been exceeded.

In this embodiment, the solid phase reaction is repeated five times.

A solid phase reaction is in this way made to occur between the HfO$_2$ film and the silicon wafer to form an HfSiOx film.

When the hafnium oxide film forming process and the heat treatment process are repeated five times by one cycle ALD, a super-thin hafnium silicate film is formed but repeating this process six times, will only form hafnium oxide film on the super-thin hafnium silicate film.

The reasons are as follows.

Namely, the silicate resulting from heat treating the HfO$_2$ film and the silicon wafer is generated the first time and/or the second time due to a simple solid phase reaction mainly between the silicon wafer and HfO$_2$ film. However, from the third time onward, a solid phase reaction occurs between the silicon wafer, HfO$_2$ film, and the HfSiOx film formed previously. Obtaining a reaction between the HfO$_2$ film and HfSiOx film is basically difficult, and the silicon wafer also does not easily reaction with the HfSiOx film. In addition, the solid phase reaction is difficult to induce from the third time onwards than previously (adsorbing the silicon into the HfO$_2$ film becomes difficult). The silicon concentration in the outermost surface of the HfSiOx film therefore drops as the number of repeat increases and that outermost surface becomes a hafnium rich HfSiOx film. In this embodiment, there is almost no gradient in the element concentrations (extremely tiny state) in the HfO$_2$ film and HfSiOx film after five repetitions, which is the reason that the solid phase reaction or in other words silicate does not occur.

Therefore, the heat treatment process and the hafnium oxide film forming process by one cycle ALD should only be repeated five times or less. A film thickness for example of 0.4 nanometers or less is sufficient.

The silicon wafer has a single crystal. The single crystal is crystal where the silicon atoms are mutually bonded in a correct and orderly array, and the crystalline orientation is correctly aligned in a fixed direction. In addition, the silicon wafer contains few defects, few impurities, and also few traps. Causing a direct solid phase reaction by heat treating the HfO$_2$ film and this silicon wafer allows forming an HfSiOx film of satisfactory quality, with few variations in the distribution of the hafnium and silicon concentration in the film, and few defects, impurities and traps because of the properties of the silicon wafer.

The invention therefore yields the advantage that the HfSiOx film can be regulated to a thin thickness since the solid phase reaction caused by heat treating the HfO$_2$ film and the silicon wafer no longer occurs after five repetitions (at point where film thickness is 0.4 nanometers) as already described.

In contrast, SiON (silicon oxynitride) film and Si$_3$N$_4$ (silicon nitride) film and SiO$_2$ film are amorphous.

Amorphous here signifies that the silicon atoms are jumbled and not in an orderly array, and that defects, impurities and traps are relatively numerous. Causing a reaction of SiON film or Si$_3$N$_4$ film with HfO$_2$ film results in large numbers of defects, impurities and traps due to the above described SiON film and Si$_3$N$_4$ film properties. Moreover, the film that is formed contains many variations in the distribution of the hafnium and silicon concentration in the film.

In another method, a Si$_3$N$_4$ film is formed on the silicon wafer, an HfO$_2$ film containing hydrogen formed on that Si$_3$N$_4$ film, and (the oxidizer at this time causes the Si$_3$N$_4$ film to become SiON) then heat treating performed to diffuse silicon from the silicon wafer side into the HfO$_2$ film to form an HfO$_2$ film containing silicon.

However, in this method the hydrogen (H) leaving from the SiON film and/or the HfO$_2$ film causes voids to form due to the heat treatment. The silicon contained in the SiON film or the silicon wafer diffuses by way of these voids into the HfO$_2$ film, and the hafnium contained in the HfO$_2$ film diffuses into the SiON film. Therefore, voids or in other words traps are formed where the silicon and hafnium have been removed (in other words equivalent to the missing hydrogen) at sections where the silicon and hafnium have been removed in the respective films. Moreover, variations in the silicon concentration and hafnium concentration in the respective films occur due to hydrogen present randomly in each film.

In this embodiment on the other hand, the silicon and/or hafnium does not diffuse through voids formed by elimination of hydrogen, and a solid phase reaction between the HfO$_2$ film and the silicon wafer or in other words a reaction wherein the atoms in the HfO$_2$ film and the silicon wafer diffuse and substitute mutually is utilized so that this embodiment renders the advantage that compared to the conventional method traps are minimal, and variations in the hafnium concentration and silicon concentration in the film are minimal.

After forming the super-thin hafnium silicate film, a hafnium oxide film serving as the high dielectric constant insulating film is formed on the super-thin hafnium silicate film (High dielectric constant film formation).

In other words, an ALD apparatus forms a hafnium oxide film as a high dielectric constant insulating film, over the super-thin hafnium silicate film formed on the silicon wafer surface.

Processing conditions are: a film forming temperature of 150 to 350 degrees C., a film forming pressure of 30 Pa, a cycle count of 20 to 40 cycles, and a film thickness of 2 to 4 nanometers.

After forming the hafnium oxide film as the high dielectric constant insulating film, nickel-silicide (NiSi) is formed as the gate electrode on the hafnium oxide film and patterning performed (Si & Ni deposition, patterning) and a MOSFET then formed after the wiring process, etc.

The characteristics of the MOSFET fabricated in this way were then measured.

Figure 5:
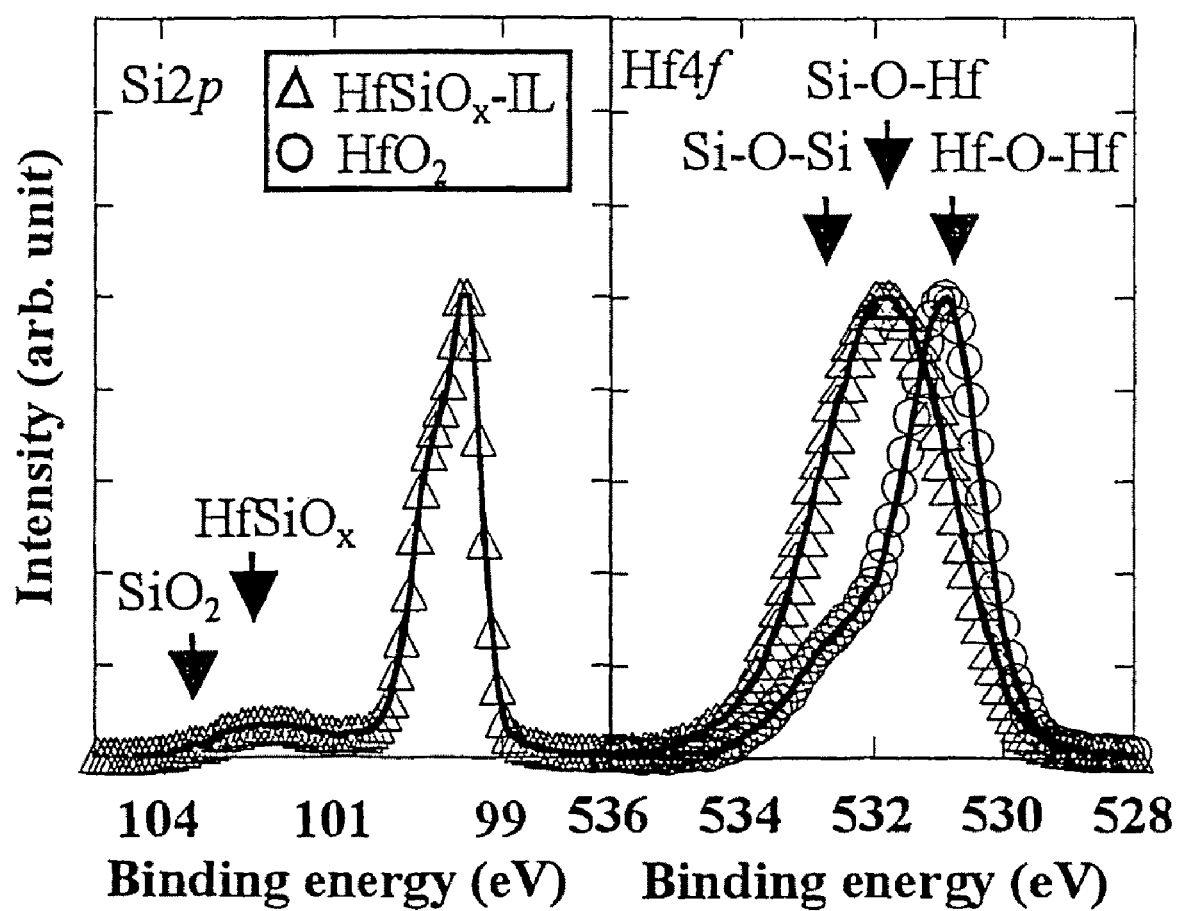
FIG. 5 is a graph showing the observation spectrum from XPS analysis immediately after forming the HfSiOx layer in the embodiment.

FIG. 5 shows the spectrum observed by XPS analysis immediately after the HfSiOx layer of this embodiment was formed as the interfacial layer.

Figure 6:
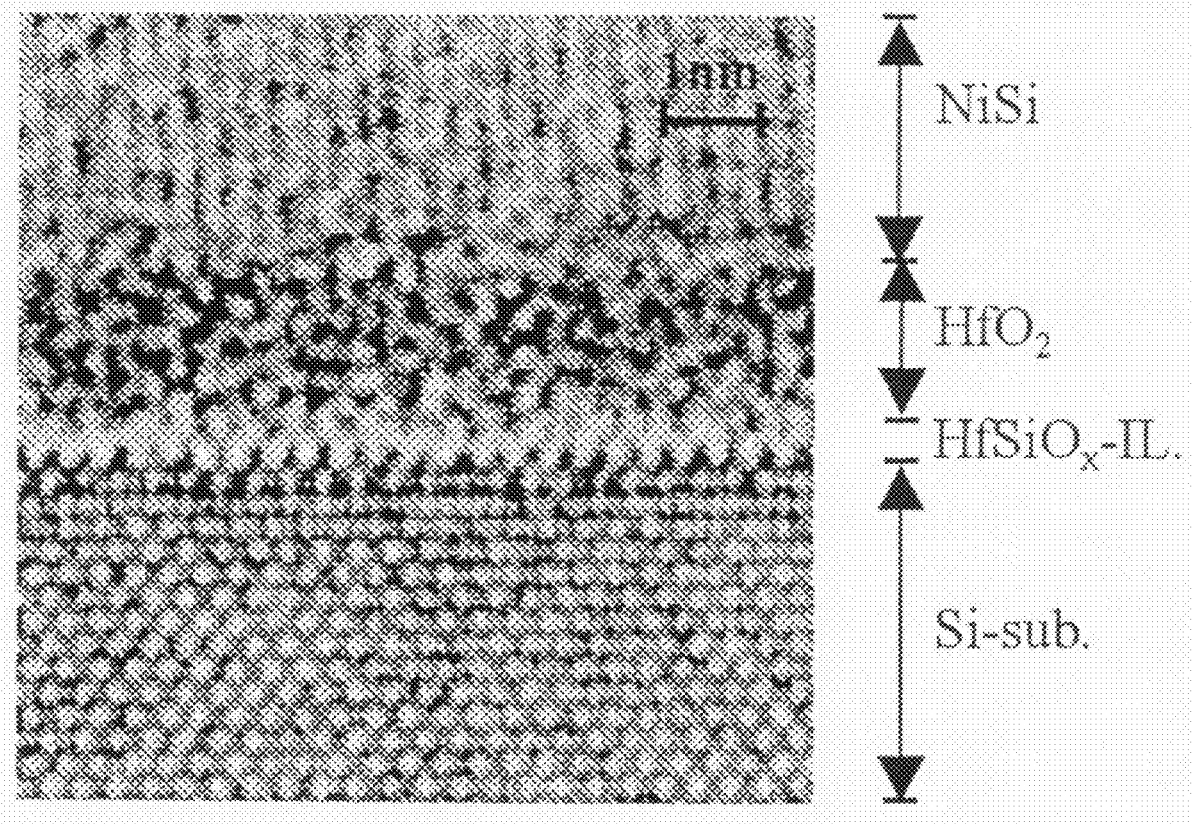
FIG. 6 is a TEM photograph of a cross section showing the high dielectric constant gate stack structure when using the super-thin hafnium silicate film of the embodiment as the interfacial layer.

FIG. 6 is a cross sectional TEM photograph showing the high dielectric constant gate stack structure utilizing the super-thin hafnium silicate film of this embodiment as the interfacial layer.

FIG. 7, FIG. 8, FIG. 9 and FIG. 10 show the respective MOSFET characteristics.

To compare the MOSFET characteristics, a structure not containing the HfSiOx layer of the present embodiment was fabricated as a comparison example and those results are described.

The following were confirmed from the XPS spectrum in FIG. 5. In this embodiment, a solid phase reaction occurs between the hafnium oxide film and the silicon wafer and a hafnium silicate film is formed.

Examining the cross sectional TEM photograph in FIG. 6 confirmed that a super-thin, flat hafnium silicate film was formed at a thickness of approximately 0.4 nanometers.

Figure 7:
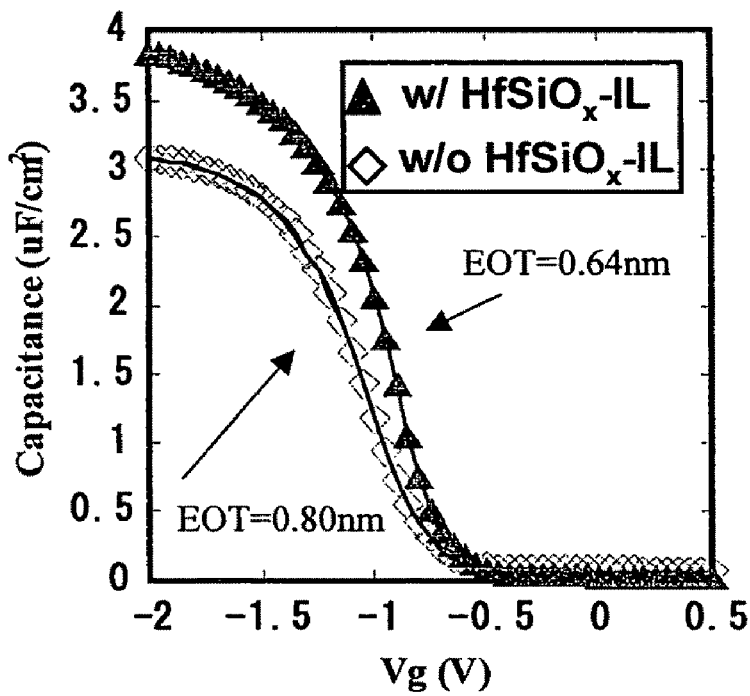
FIG. 7 is a graph showing the CV characteristics of the MOSFET capacitors in the comparative example and the embodiment.

FIG. 7 is a graph showing the CV characteristics of the High dielectric constant gate stack MOS capacitor utilizing the HfSiOx layer of the present embodiment as the interfacial layer.

Examining the graph in FIG. 7 reveals that the high dielectric constant gate stack structure utilizing the super-thin hafnium silicate layer of the present embodiment has a large capacitance and an EOT of approximately 0.6 nanometers.

Figure 8:
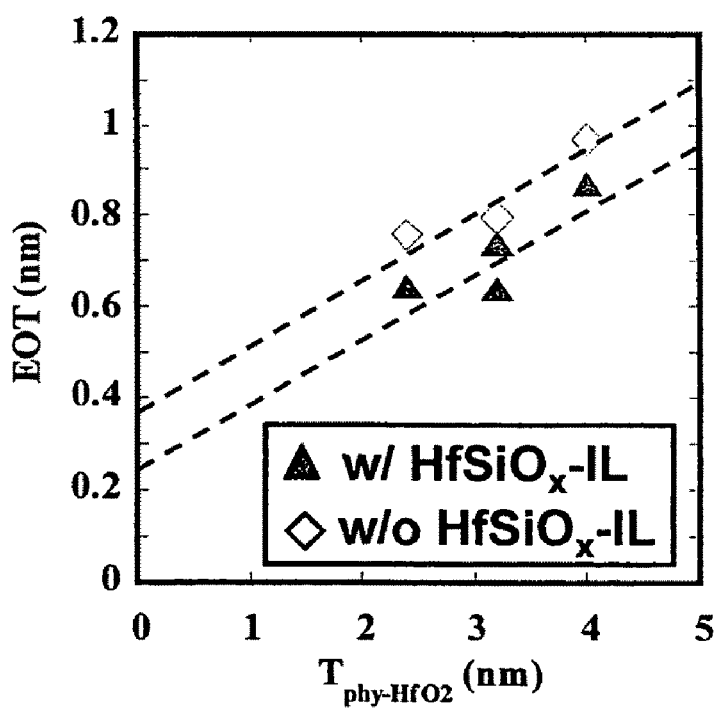
FIG. 8 is a graph showing the relation of EOT to the physical film thickness of the hafnium oxide in the comparative example and the embodiment.

FIG. 8 is a graph showing the relation of the EOT to the physical film thickness of the hafnium oxide.

A fragment showing the EOT of the interfacial layer revealed the following.

The high dielectric constant gate stack structure utilizing the hafnium silicate film has an EOT of 0.24 nanometers in the interfacial layer. Calculating the dielectric constant by using a physical film thickness (approximately 0.4 nanometers) obtained from the results observed in the cross sectional TEM photograph yields an estimated dielectric constant of approximately 7 for the super-thin hafnium silicate film formed in this embodiment, and that the hafnium silicate film that was formed contains approximately 30 percent hafnium.

The high dielectric constant gate stack structure not containing the super-thin hafnium silicate film, is predicted to have an interfacial layer with an EOT of 0.38 nanometers and an SiOx layer with a low dielectric constant.

Figure 9:
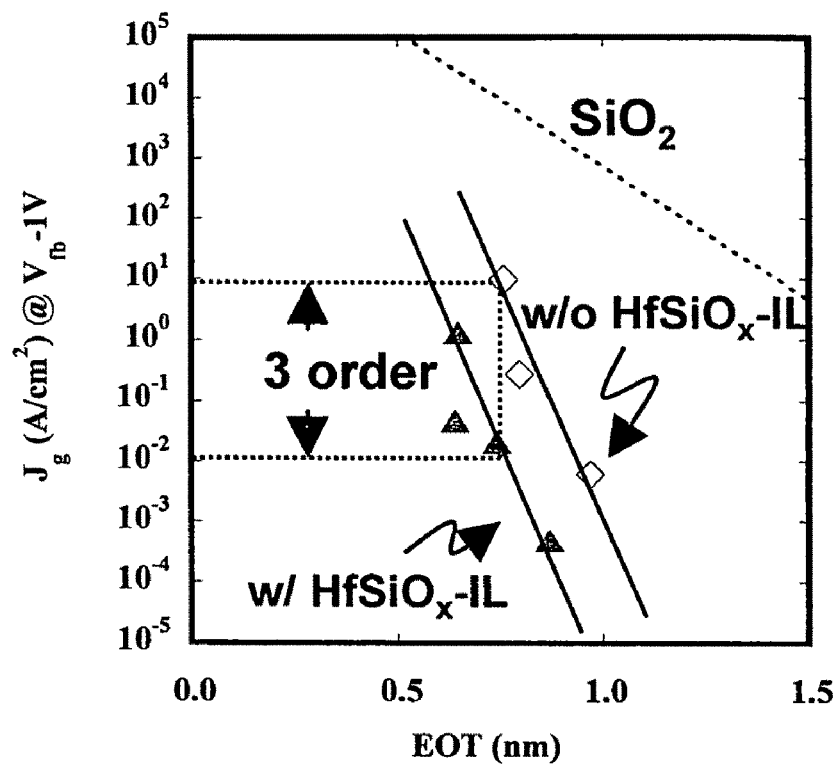
FIG. 9 is a graph showing the EOT-Jg characteristics in the comparative example and the embodiment.

FIG. 9 is a graph showing the EOT-Jg characteristics of the high dielectric constant gate stack MOS capacitor utilizing the HfSiOx layer of this embodiment as the interfacial layer.

The high dielectric constant gate stack structure using the super-thin hafnium silicate film of this embodiment possesses the Jg merit of nearly six figures compared to the gate stack utilizing a silicon oxide ($SiO_2$) film as the gate insulating film.

Even compared to the high dielectric constant gate stack structure not containing the super-thin hafnium silicate film of this embodiment, this gate stack structure possesses the Jg merit of approximately three figures.

Figure 10:
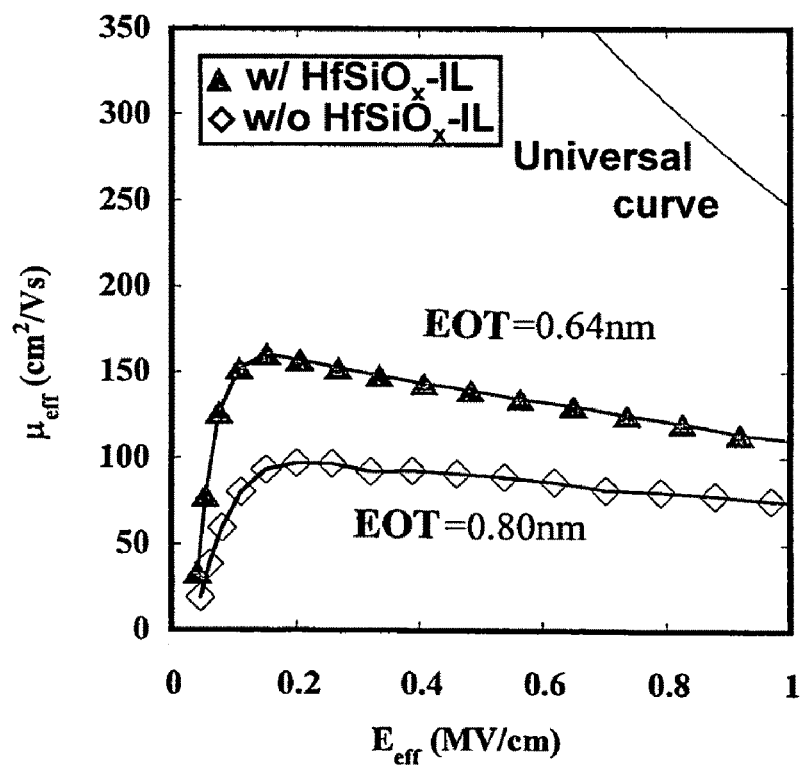
FIG. 10 is a graph showing the electric field dependency on the effective electron mobility in the comparative example and the embodiment.

FIG. 10 is a graph showing the electric field dependency on the effective electron mobility of the high dielectric constant gate stack MOSFET utilizing the HfSiOx layer of this embodiment as the interfacial layer.

This embodiment possesses a high effective electron mobility compared to the high dielectric constant gate stack structure not containing the super-thin hafnium silicate film of this embodiment.

As already described, the high dielectric constant gate stack structure utilizing the super-thin hafnium silicate film of this embodiment as the interfacial layer yields an extremely thin EOT, has large benefits in terms of leak current, as well as satisfactory MOSFET characteristics.

The present invention is not limited to the above embodiments and needless to say, all manner of adaptations and variations not departing from the spirit and scope of the present invention are allowable.

In the above embodiment, an example was described that implements the hafnium oxide film forming process and a heat treatment process utilizing a cluster apparatus that integrates an RTP apparatus and an ALD apparatus. However, this invention is not limited to this example and may apply to a method that performs a hafnium oxide film forming process and a heat treatment process within the same processing chamber.

Moreover, this invention is not limited to utilize a heat treating apparatus and a single-wafer film forming apparatus, and may also utilize a batch type film forming apparatus and a heat treating apparatus.

The above embodiment described for example a gate insulating film but insulating film of this invention is not limited to a gate insulating film and may also be a capacitor insulating film.

Moreover, the metal oxide film for forming an interfacial layer, and the high dielectric constant insulating film formed on the interfacial layer were the same film in the embodiment but may be different films.

Further, the metal oxide film for forming the interfacial layer and/or the high dielectric constant insulating film need not be limited to hafnium oxide.

The material for forming the metal oxide film and/or high dielectric constant insulating film may be oxide containing a single or multiple elements selected from a group including Hf, Ta, Al, Zr, La and Y, or may be an oxide containing a stack structure where the above oxides are arranged vertically, etc.

The material for example may be: $HfSiO_x$, $Ta_2O_5$, $Al_2O_3$, $ZrO_2$, $HfAlO_x$, $HfAlON$, $HfON$, $La_2O_3$, $Y_2O_3$, $HfO_2/Al_2O_3$, $HfO_2/ZrO_2$, $HfO_2/Al_2O_3/HfO_2$, etc.

The material for forming the capacitor insulating film may be: BST (Ba—Sr—$TiO_3$), STO(Sr—$TiO_3$).

The substrate for processing is not limited to the wafer, and may include glass substrates or liquid crystal panels, etc., in processes for manufacturing LCD devices.

Preferred aspects of the present invention are described next.

One aspect of the present invention provides a semiconductor device manufacturing method comprising the steps of:

forming a metal oxide film on a silicon substrate, and forming a silicate film by inducing a solid phase reaction between the metal oxide film and the silicon substrate by heat treatment, and forming a high dielectric constant insulating film on the silicate film.

The silicate film is preferably formed by repeating the forming of the metal oxide film, and the inducing of the solid phase reaction by heat treatment.

The silicate film is preferably formed by repeating the forming of the metal oxide film of one atomic layer or less, and the inducing of the solid phase reaction by heat treatment.

The silicate film is preferably formed by repeating the forming of the metal oxide film by an ALD method at one to three cycles, and the inducing of the solid phase reaction by heat treatment.

The heat treatment is preferably performed at a temperature higher than the temperature when the metal oxide film is formed, and lower than the temperature at which the silicate film changes into silicide.

The metal oxide film is preferably the same film as the high dielectric constant insulating film.

The metal oxide film and the high dielectric constant insulating film are preferably hafnium oxide film, and the silicate film is hafnium silicate film.

Another aspect of the present invention provides a semiconductor device manufacturing method comprising the steps of:
forming a silicate film by repeating forming of a high dielectric constant insulating film on a silicon substrate and inducing of a solid phase reaction between the high dielectric constant insulating film and the silicon substrate by heat treatment, and
forming a high dielectric constant insulating film on the silicate film.

Yet another aspect of the present invention provides a semiconductor device manufacturing method comprising the steps of:
forming a hafnium silicate film by repeating forming of a hafnium oxide film on a silicon substrate, and inducing of a solid phase reaction between the hafnium oxide film and the silicon substrate by heat treatment, and
forming a hafnium oxide film on the hafnium silicate film.

Still another aspect of the present invention provides a substrate processing apparatus comprising:
a first processing chamber for forming a high dielectric constant insulating film on a silicon substrate,
a second processing chamber for heat treating the silicon substrate,
a transfer chamber installed between the first processing chamber and the second processing chamber for transferring the silicon substrate between the first processing chamber and the second processing chamber,
a transfer robot installed in the transfer chamber for transferring the silicon substrate;
a controller for controlling the operation to; transfer the silicon substrate into the first processing chamber by the transfer robot, and form the high dielectric constant insulating film on the silicon substrate in the first processing chamber, and transfer the silicon substrate formed with the high dielectric constant insulating film from the first processing chamber into the second processing chamber by the transfer robot, and heat treat the silicon substrate formed with the high dielectric constant insulating film in the second processing chamber to induce a solid phase reaction between the high dielectric constant insulating film and the silicon substrate to form a silicate film, and repeat these operations to form a silicate film with a specified film thickness on the surface of the silicon substrate, and then transfer the silicon substrate formed with the silicate film with the specified thickness from the second processing chamber into the first processing chamber, and form a high dielectric constant insulating film on the silicate film with the specified film thickness in the first processing chamber.

The invention claimed is:

1. A semiconductor device manufacturing method comprising the steps of:
    forming a silicate film by alternately performing a first step of forming a metal oxide film on a silicon substrate of a single crystal, and a second step of inducing a solid phase reaction between the metal oxide film and the single-crystal silicon on a surface of the silicon substrate by heat treatment, and
    forming a high dielectric constant insulating film on the silicate film after forming the silicate film.

2. The semiconductor device manufacturing method according to claim 1, wherein the heat treatment in the second step is performed at a temperature higher than the temperature when the metal oxide film is formed in the first step, and lower than the temperature at which the silicate film changes into silicide.

3. The semiconductor device manufacturing method according to claim 1, wherein both the metal oxide film and the high dielectric constant insulating film are composed of the same material.

4. The semiconductor device manufacturing method according to claim 1, wherein the metal oxide film and the high dielectric constant insulating film are hafnium oxide films, and the silicate film is hafnium silicate film.

5. A semiconductor device manufacturing method comprising the steps of:
    forming a silicate film by alternately repeating a first step of forming a high dielectric constant insulating film on a silicon substrate of a single crystal, and a second step of inducing a solid phase reaction between the high dielectric constant insulating film and the single-crystal silicon on a surface of the silicon substrate by heat treatment, and
    forming a high dielectric constant insulating film on the silicate film after forming the silicate film.

6. A semiconductor device manufacturing method comprising the steps of:
    forming a hafnium silicate film by alternately repeating a first step of forming a hafnium oxide film on a silicon substrate of a single crystal, and a second step of inducing a solid phase reaction between the hafnium oxide film and the single-crystal silicon on a surface of the silicon substrate by heat treatment, and
    forming a hafnium oxide film on the hafnium silicate film after forming the hafnium silicate film.

7. A semiconductor device manufacturing method comprising the steps of:
    forming a silicate film by alternately repeating a first step of forming a metal oxide film on a silicon substrate of a single crystal, and a second step of inducing a solid phase reaction between the metal oxide film and the single-crystal silicon on a surface of the silicon substrate by heat treatment, and
    forming a high dielectric constant insulating film on the silicate film after forming the silicate film.

8. The semiconductor device manufacturing method according to claim 7, wherein the metal oxide film formed in the first step has a thickness of one atomic layer or less.

9. The semiconductor device manufacturing method according to claim 7, wherein the metal oxide film is formed by performing one to three cycles of an ALD method in the first step.

10. The semiconductor device manufacturing method according to claim 7, wherein the first step comprises a cycle of two steps of
   (a) adsorbing a material on the surface of the silicon substrate, and
   (b) reacting an oxidizer with the material adsorbed on the surface of the silicon substrate,
and
   wherein the cycle is performed one to three times in the first step.

11. The semiconductor device manufacturing method according to claim 10, wherein the cycle is performed one time in the first step.

12. The semiconductor device manufacturing method according to claim 7, wherein the first step is performed in a processing chamber, and wherein the first step comprises a cycle of four steps of
   (a) supplying a material into the processing chamber,
   (b) purging the interior of the processing chamber to exhaust the material supplied into the processing chamber,
   (c) supplying an oxidizer into the processing chamber, and
   (d) purging the interior of the processing chamber to exhaust the oxidizer supplied into the processing chamber, and
   wherein the cycle is performed one to three times in the first step.

13. The semiconductor device manufacturing method according to claim 12, wherein the cycle is performed one time in the first step.

14. The semiconductor device manufacturing method according to claim 7, wherein the metal oxide film is formed by performing one cycle of an ALD method in the first step.

15. The semiconductor device manufacturing method according to claim 7, wherein the first step and the second step are repeated five times or less in the step of forming the silicate film.

16. The semiconductor device manufacturing method according to claim 7, wherein the silicate film has a thickness of 0.4 nm or less.

17. A substrate processing method comprising the steps of:
   forming a silicate film by alternately performing a first step of forming a metal oxide film on a silicon substrate of a single crystal, and a second step of inducing a solid phase reaction between the metal oxide film and the single-crystal silicon on a surface of the silicon substrate by heat treatment, and
   forming a high dielectric constant insulating film on the silicate film after forming the silicate film.

18. A substrate processing method comprising the steps of:
   forming a silicate film by alternately repeating a first step of forming a metal oxide film on a silicon substrate of a single crystal, and a second step of inducing a solid phase reaction between the metal oxide film and the single-crystal silicon on a surface of the silicon substrate by heat treatment, and
   forming a high dielectric constant insulating film on the silicate film after forming the silicate film.

* * * * *